(12) United States Patent
Kayama et al.

(10) Patent No.: US 11,417,808 B2
(45) Date of Patent: Aug. 16, 2022

(54) LIGHT EMITTING DEVICE

(71) Applicant: NICHIA CORPORATION, Anan (JP)

(72) Inventors: Kiyoshi Kayama, Anan (JP); Shohei Mori, Anan (JP); Akinobu Maeda, Tokushima (JP)

(73) Assignee: NICHIA CORPORATION, Anan (JP)

( * ) Notice: Subject to any disclaimer, the term of this patent is extended or adjusted under 35 U.S.C. 154(b) by 234 days.

(21) Appl. No.: 17/001,188

(22) Filed: Aug. 24, 2020

(65) Prior Publication Data

US 2021/0083153 A1    Mar. 18, 2021

(30) Foreign Application Priority Data

Sep. 12, 2019  (JP) .............................. JP2019-165852
Dec. 17, 2019  (JP) .............................. JP2019-227014
Apr. 6, 2020   (JP) .............................. JP2020-068293

(51) Int. Cl.
| | |
|---|---|
| H01L 33/56 | (2010.01) |
| H01L 33/60 | (2010.01) |
| H01L 33/62 | (2010.01) |
| H01L 33/48 | (2010.01) |
| H01L 25/16 | (2006.01) |

(52) U.S. Cl.
CPC .............. *H01L 33/56* (2013.01); *H01L 33/60* (2013.01); *H01L 33/62* (2013.01)

(58) Field of Classification Search
CPC ......... H01L 33/60; H01L 33/56; H01L 33/62; H01L 33/486; H01L 25/167
See application file for complete search history.

(56) References Cited

U.S. PATENT DOCUMENTS

| | | |
|---|---|---|
| 2007/0247841 A1 | 10/2007 | Kono et al. |
| 2011/0127566 A1 | 6/2011 | Yoon |
| 2013/0043501 A1 | 2/2013 | Kobayakawa et al. |
| 2013/0056780 A1 | 3/2013 | Kono |
| 2014/0070259 A1 | 3/2014 | Yoon et al. |
| 2014/0252574 A1 | 9/2014 | Nakabayashi et al. |
| 2016/0072028 A1 | 3/2016 | Naka |

(Continued)

FOREIGN PATENT DOCUMENTS

| | | |
|---|---|---|
| JP | 2007311736 A | 11/2007 |
| JP | 2010283261 A | 12/2010 |

(Continued)

*Primary Examiner* — Marcos D. Pizarro
*Assistant Examiner* — Antonio B Grite
(74) *Attorney, Agent, or Firm* — Global IP Counselors, LLP

(57) ABSTRACT

A light emitting device includes: a resin package including first and second leads, and a resin part defining a recess defined by a lateral wall and an upward-facing surface, which includes an upper surface of a portion of each of the first lead, the second lead, and the resin part; and a light emitting element on the first lead. The resin part includes a holding resin portion between the first and second leads at the upward-facing surface, and a covering resin portion that covers a portion of the upper surface of the holding resin portion and a portion of an upper surface of at least one of the first and second leads. A portion of an upper surface of the holding resin portion is exposed from the covering resin portion, and is located on the same plane as the upper surfaces of the first and second leads.

31 Claims, 28 Drawing Sheets

(56) References Cited

U.S. PATENT DOCUMENTS

| | | |
|---|---|---|
| 2017/0186927 A1 | 6/2017 | Naka et al. |
| 2017/0213944 A1 | 7/2017 | Naka et al. |
| 2018/0226544 A1 | 8/2018 | Isono et al. |

FOREIGN PATENT DOCUMENTS

| | | | |
|---|---|---|---|
| JP | 2011119729 A | 6/2011 | |
| JP | 2011233800 A | 11/2011 | |
| JP | 2012079723 A | 4/2012 | |
| JP | 2013055190 A | 3/2013 | |
| JP | 2013115116 A | 6/2013 | |
| JP | 2013125776 A | 6/2013 | |
| JP | 2013131519 A | 7/2013 | |
| JP | 2014057060 A | 3/2014 | |
| JP | 2014158011 A | 8/2014 | |
| JP | 2016021446 A | 2/2016 | |
| JP | 2016054251 A | 4/2016 | |
| JP | 2017027991 A | 2/2017 | |
| JP | 2017120889 A | 7/2017 | |
| JP | 2017130640 A | 7/2017 | |
| JP | 2017204623 A | 11/2017 | |
| JP | 2018125509 A | 8/2018 | |
| JP | 2019033263 A | 2/2019 | |
| WO | 2014136824 A1 | 9/2014 | |
| WO | WO-2020017922 A1 * | 1/2020 | ............. H01L 24/48 |

\* cited by examiner

LIGHT EMITTING DEVICE

CROSS-REFERENCE TO RELATED APPLICATIONS

This application claims priority to Japanese Patent Application No. 2019-165852 filed on Sep. 12, 2019, Japanese Patent Application No. 2019-227014 filed on Dec. 17, 2019, and Japanese Patent Application No. 2020-068293 filed on Apr. 6, 2020. The entire disclosures of Japanese Patent Application Nos. 2019-165852, 2019-227014 and 2020-068293 are hereby incorporated herein by reference.

TECHNICAL FIELD

The present disclosure relates to a light emitting device.

BACKGROUND ART

Light emitting devices using light emitting elements such as an LED can easily obtain high luminous efficiency, and accordingly are used in many devices including backlights for display devices, etc., and lighting fixtures. For example, Japanese Laid-Open Patent Application Publication No. 2013-125776 illustrates a light emitting device including a resin package having a pair of positive and negative leads and defining a recess, and a light emitting element mounted on an upward-facing surface of the recess of the resin package.

SUMMARY

Because light emitting devices using light emitting elements such as LEDs are used in various applications, mechanical strength needs to be improved. In light of that, one object of certain embodiments of the present invention is to provide a light emitting device that can have an improved strength.

A light emitting device according to one aspect of the present disclosure includes a resin package and a light emitting element. The resin package has an elongated rectangular shape and includes a first lead and a second lead, and a resin part holding the first lead and the second lead. The resin package defines a recess defined by a lateral wall and an upward-facing surface constituting a bottom of the recess. The upward-facing surface includes an upper surface of a portion of the first lead, an upper surface of a portion of the second lead, and an upper surface of a portion of the resin part. The lateral wall includes a portion of the resin part. The light emitting element is disposed on the first lead at the upward-facing surface of the recess. In a top view, the lateral wall includes a first long lateral wall and a second long lateral wall facing each other and extending in a first direction, and a first short lateral wall and a second short lateral wall facing each other and extending in a second direction orthogonal to the first direction. The first long lateral wall includes a first part located on the first lead, and having an upper end and a lower end that is located on the upward-facing surface of the recess, and a second part located on the first lead and the second lead, and having an upper end and a lower end that is located on the upward-facing surface of the recess. In the second direction, a width of the second part at the lower end is greater than a width of the first part at the lower end.

A light emitting device according to another aspect of the present disclosure includes a resin package, a light emitting element and a wire. The resin package has an elongated rectangular shape and includes a first lead and a second lead, and a resin part holding the first lead and the second lead. The resin package defines a recess defined by a lateral wall and an upward-facing surface constituting a bottom of the recess. The upward-facing surface includes an upper surface of a portion of the first lead, an upper surface of a portion of the second lead, and an upper surface of a portion of the resin part. The lateral wall includes a portion of the resin part. The light emitting element is disposed on the first lead at the upward-facing surface of the recess. The wire electrically connects the light emitting element and the second lead. In a top view, the lateral wall includes a first long lateral wall and a second long lateral wall facing each other and extending in a first direction, and a first short lateral wall and a second short lateral wall facing each other and extending in a second direction orthogonal to the first direction. The resin part includes a holding resin portion located between the first lead and the second lead at the upward-facing surface of the recess, and a covering resin portion that covers a portion of an upper surface of the holding resin portion and at least one of a portion of an upper surface of the first lead and a portion of an upper surface of the second lead. A portion of the upper surface of the holding resin portion is exposed from the covering resin portion, and the portion of the upper surface of the holding resin portion exposed from the covering resin portion is located on the same plane as the upper surface of the first lead and the upper surface of the second lead.

According to certain embodiments of the present disclosure, it is possible to provide a light emitting device that can have an improved strength.

DETAILED DESCRIPTION OF EMBODIMENTS

Figure 1A:
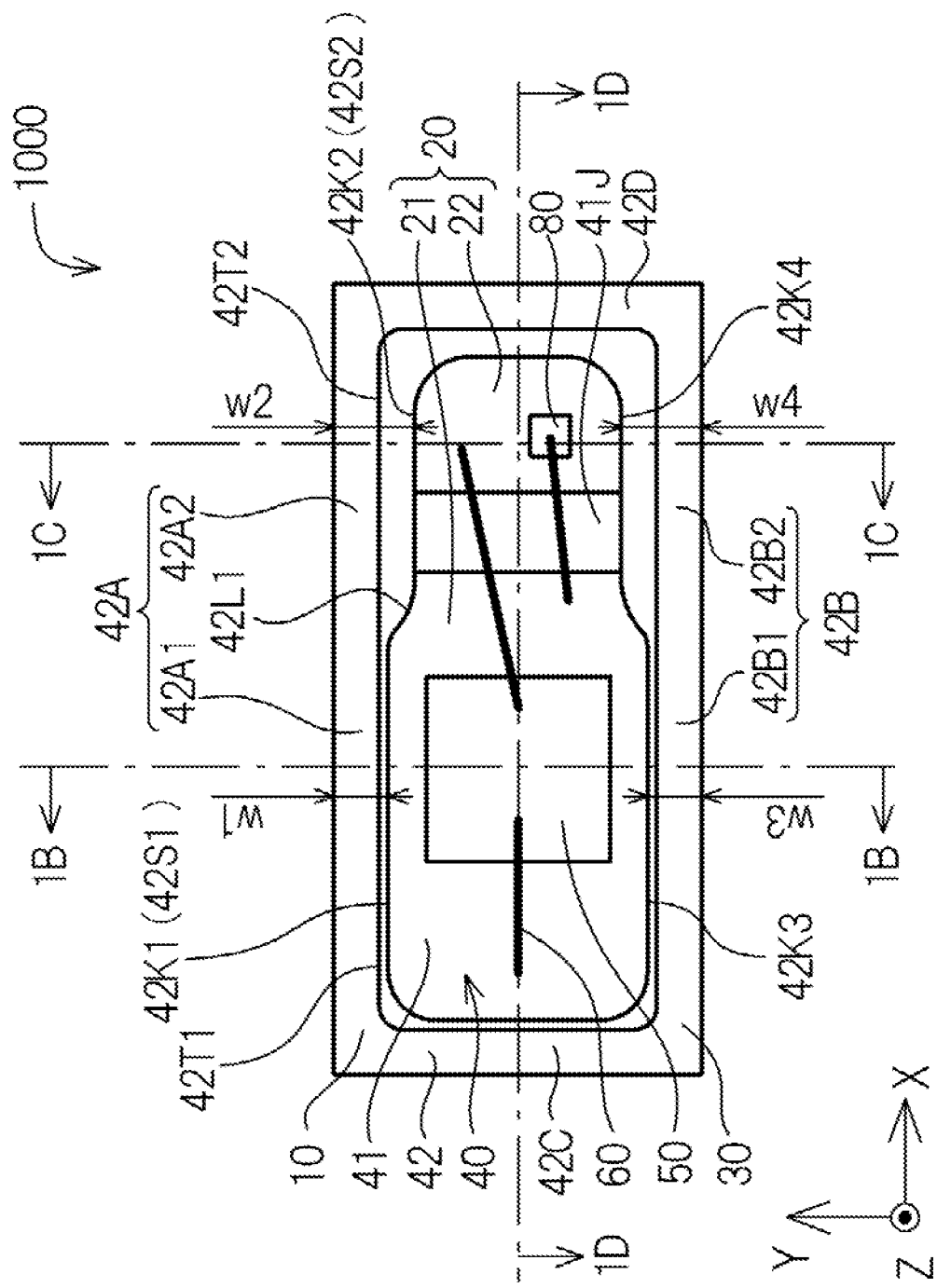
FIG. 1A is a schematic top view of a light emitting device of a first embodiment.

The light emitting device according to certain embodiments of the present disclosure will be described below in detail referring to the drawings. The light emitting devices described below are examples, and the light emitting device according to the present disclosure is not limited to the light emitting devices described below. In the description hereafter, terminology indicating a specific direction or position (e.g. "up," "down," and other terms including those terms) may be used. Those terms are used merely for ease of understanding a relative direction or position in a referenced drawing. Also, for ease of understanding, the size or positional relationship, etc., of elements shown in the drawings may be exaggerated, and may not reflect the size in an actual light emitting device or the size relationship between elements of an actual light emitting device.

FIRST EMBODIMENT

A light emitting device 1000 of the first embodiment of the present invention is described based on FIG. 1A to FIG. 7B. To show the interior structure, in FIG. 1A and FIG. 4A, a covering member 70 is shown as a transparent member.

The light emitting device 1000 comprises a resin package 10 and a light emitting element 50. The resin package 10 comprises leads 20 and a resin part 30. The leads 20 includes a first lead 21 and a second lead 22. In a top view, the resin package 10 has a rectangular shape. The resin package 10 defines a recess 40 defined by an upward-facing surface 41 and a lateral wall 40. The upward-facing surface 41 defines a bottom of the recess 40, and includes an upper surface of a portion of the first lead 21, an upper surface of a portion of the second lead 22, and an upper surface of a portion of the resin part 30. The lateral wall 42 includes a portion of the resin part 30. In the top view, the lateral wall 42 includes a first long lateral wall portion 42A and a second long lateral wall portion 42B facing each other and extending in a first direction, and a first short lateral wall 42C and a second short lateral wall 42D facing each other and extending in a second direction. The first long lateral wall 42A includes a first part 42A1 located on the first lead 21, and a second part 42A2 located on the first lead and the second lead. The first part 42A1 has an upper end 42T1 and a lower end 42K1, and the second part 42A2 has an upper end 42T2 and a lower end 42K2. In the second direction, the second part 42A2 has a width w2 at the lower end 42K2 greater than a width w1 of the first part 42A1 at the lower end 42K1.

The lower end 42K1 of the first part 42A1 and the lower end 42K2 of the second part 42A2 extend in the first direction on the upward-facing surface 41 of the recess 40. The light emitting element 50 is disposed on the first lead 21 on the upward-facing surface 41 of the recess 40. The resin part located between the first lead and the second lead on the upward-facing surface of the recess may be referred to as a "bottom resin part 41J". Any appropriate number of light emitting elements may be employed, and a single or a plurality of light emitting elements may be employed. The expression "extending in the first direction" in this specification allows deviation within ±3°. Also, the expression "orthogonal" in this specification allows deviation within 90±3°. The expression "parallel" in this specification allows deviation within ±3°. Also, the first direction refers to the X axis direction in FIG. 1A, and the second direction refers to the Y axis direction in FIG. 1A.

The second long lateral wall 42B preferably includes a third part 42B1 located on the first lead 21, and a fourth part 42B2 located on the first lead and the second lead. In the second direction, it is preferable that a width w4 of the fourth part 42B2 at a lower end 42K4 of the fourth part 42B2 be greater than a width w3 of the third part 42B1 at the lower end 42K3 of the third part 42B1. The lower end 42K3 of the third part 42B1 and the lower end 42K4 of the fourth part 42B2 extend in the first direction on the upward-facing surface 41 of the recess 40.

The first part 42A1 is described below, and the third part 42B1 may have the same shape as the first part 42A1. Also, the second part 42A2 is described below, and the fourth part 42B2 may have the same shape as the second part 42A2. In other words, the first long lateral wall and the second long lateral wall may be linearly symmetrical with respect to the connecting line of the center of the first short lateral wall and the center of the second short lateral wall in the top view.

The expression "the lower end 42K1 of the first part 42A1 extends in the first direction" refers to that at least a portion of the lower end 42K1 of the first part is parallel to the first direction on the upward-facing surface 41 of the recess 40. The expression "a portion of the lower end 42K1 of the first part extending in the first direction" refers to a portion of the lower end 42K1 that is parallel to the first direction, and may be referred to as a "first extended lower end 42S1". Similarly, the expression "the lower end 42K2 of the second part 42A2 extends in the first direction" refers to that at least a portion of the lower end 42K2 of the second part 42A2 is parallel to the first direction on the upward-facing surface 41 of the recess 40. The expression "a portion of the lower end 42K2 of the second part 42A2 extending in the first direction" refers to a portion of the lower end 42K2 that is parallel to the first direction, and may be referred to as a "second extended lower end 42S2". In the second direction, the width w1 at the lower end 42K1 of the first part refers to the distance between the first extended lower end 42S1 and an outer lateral surface of the first part. Similarly, in the second direction, the width w2 at the lower end 42K2 of the second part refers to the distance between the second extended lower end 42S2 and the outer lateral surface of the second part.

Figure 1B:
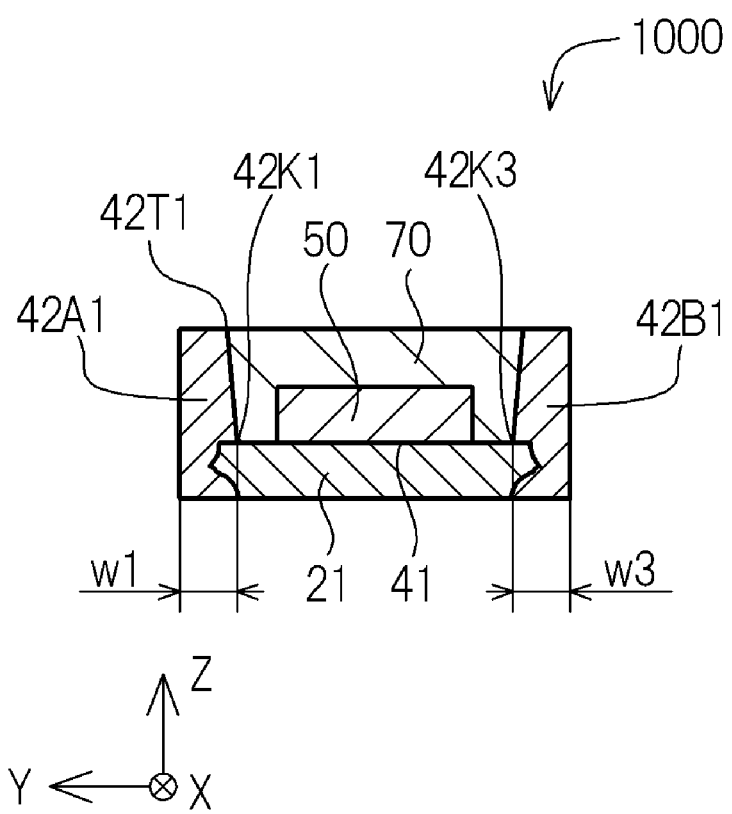
FIG. 1B is a schematic cross-sectional view taken along line 1B-1B in FIG. 1A.
Figure 1C:
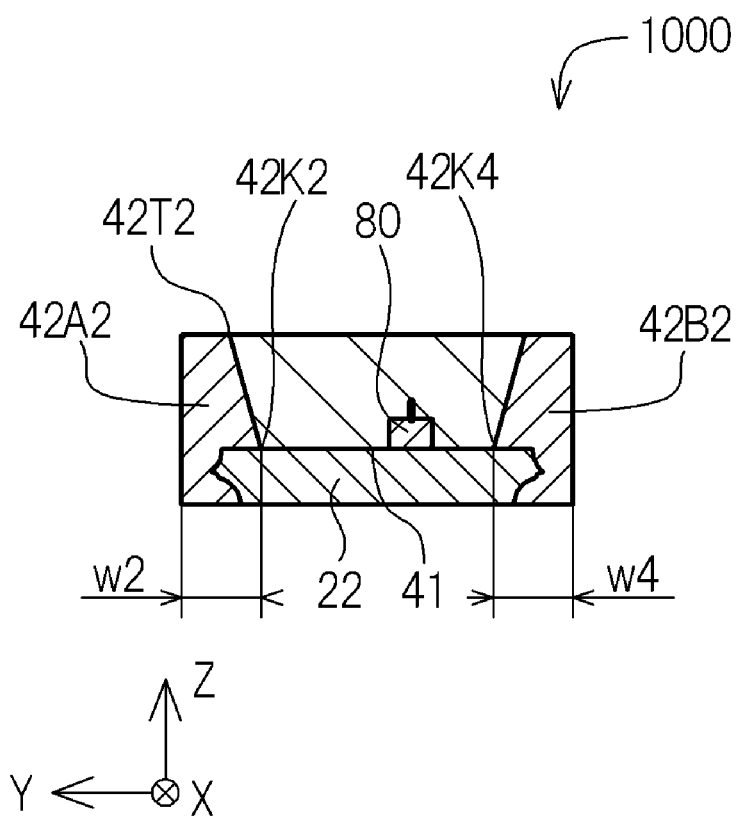
FIG. 1C is a schematic cross-sectional view taken along line 1C-1C in FIG. 1A.

As shown in FIG. 1B, the "lower end 42K1 of the first part 42A1" refers to the edge of the inner lateral surface of the first part 42A1 located on the upward-facing surface 41 of the recess 40. As shown in FIG. 1C, the "lower end 42K2 of the second part 42A2" refers to the edge of the inner lateral surface of the second part 42A2 located on the upward-facing surface 41 of the recess 40.

The expression "the first long lateral wall 42A extends in the first direction" refers to that at least a portion of the outer lateral surface of the first long lateral wall 42A is parallel to the first direction. The expression "the second long lateral wall 42B extends in the first direction" refers to that at least a portion of the outer lateral surface of the second long lateral wall 42B is parallel to the first direction. The expression "the first short lateral wall 42C extends in the second direction" refers to that at least a portion of the outer lateral surface of the first short lateral wall 42C is parallel to the second direction. The expression "the second short lateral wall 42D extends in the second direction" refers to that at least a portion of the outer lateral surface of the second short lateral wall 42D is parallel to the second direction.

With the width w2 at the lower end of the second part located on the first lead and the second lead being greater than the width w1 of the first part 42A1 at the lower end 42K1, it is possible to increase a size of the second part 42A2 that covers the first lead and the second lead larger. This allows for improving the strength of the second part, so it is possible to increase the strength of the light emitting device. For example, improvement in the strength of the second part that covers the first lead and the second lead allows for reducing the occurrence of cracks in the bottom resin part 41J. Also, with a small width w1 at the lower end of the first part located on the first lead on which the light emitting element is disposed, it is possible to increase the surface area of the first lead 21 exposed from the resin part. This allows for increasing the size of the light emitting element, so it is possible to improve the light output of the light emitting device. Also, an increase of the surface area of the first lead 21 exposed from the resin part allows for facilitating disposing of the light emitting element.

In the top view, the resin package 10 has a rectangular shape, and the first long lateral wall extends in the first direction. In other words, the outer lateral surface of the first part and the outer lateral surface of the second part are in the same plane. Accordingly, the lower end of the first part extends in the first direction, which facilitates the first part 42A1 to have a constant width in the second direction at the lower end 42K1. Similarly, with the first long lateral wall extending in the first direction, the lower end 42K2 of the second part 42A2 extends in the first direction, which facilitates the second part to have a constant width in the second direction at the lower end 42K2. Accordingly, the width of the first part at the lower end of the first part in the second direction and the width of the second part at the lower end of the second part in the second direction can be set to be reduced considering the strength of the resin package. Allowing reduction in the width of the first part at the lower end of the first part and the width of the second part at the lower end of the second part in the second direction allows for increasing the surface area of the first lead 21 and the second lead 22 exposed from the resin part. Accordingly, the light emitting element 50 and/or wires 60 can be easily disposed. When mounting a protective element 80 on the first lead 21 and/or the second lead 22, the protective element 80 can be easily disposed.

The first extended lower end 42S1 and the second extended lower end 42S2 can be connected together by a portion of the lower end 42K2 of the second part 42A2 parallel to the second direction, or can be connected together by a portion of the lower end 42K2 of the second part 42A2 inclined with respect to the second direction. This portion of the lower end 42K2 of the second part 42A2 that connects the first extended lower end 42S1 and the second extended lower end 42S2 together and that is inclined with respect to the second direction is referred to as a "first connecting lower end 42L1". In other words, the second part 42A2 includes a first joining part that includes the first connecting lower end 42L1. In the second direction, the width of the first joining part is greater than the width w1 of the first part 42A1 at the lower end 42K1, and smaller than the width w2 of the second part 42A2 at the lower end 42K2. As shown in FIG. 1A, it is preferable that the first extended lower end 42S1 and the second extended lower end 42S2 be connected via the first connecting lower end 42L1 without a corner portion. In other words, it is preferable that the first connecting lower end 42L1 be curved. With this structure, the concentration of stress at a corner portion does not occur, so it is possible to reduce the occurrence of cracks on the second part 42A2. The first connecting lower end 42L1 is located on the first lead, the second lead, and/or the bottom resin part. For example, the first connecting lower end 42L1 may be located on the first lead, the second lead, and the bottom resin part, and may be located on the first lead and the bottom resin part to be separated from the second lead. As shown in FIG. 1A, it is preferable that the first connecting lower end 42L1 be located only on the first lead, and be separated from the second lead and the bottom resin part. With this structure, it is possible to extend the length of the second extended lower end in the first direction, so it is possible to increase the volume of the second part 42A2. This allows for improving the strength of the second part.

It is preferable that in the second direction, an inner lateral surface of the first part 42A1 and a corresponding lateral surface of the light emitting element face each other, and that an inner lateral surface of the second part 42A2 and the corresponding lateral surface of the light emitting element do not face each other. With the width of the first part 42A1 at the lower end 42K1 smaller than the width of the second part 42A2 at the lower end 42K2. A structure in which the inner lateral surface of the first part and the corresponding lateral surface of the light emitting element face each other allows for increasing the minimum distance between the corresponding lateral surface of the light emitting element and the first long lateral wall 42A compared to when the corresponding lateral surface of the light emitting element and the inner lateral surface of the second part 42A2 face each other. Increase in the distance between the lateral surface of the light emitting element and the first long lateral wall 42A allows for facilitating disposing of the light emitting element.

It is preferable that the lateral surface of the light emitting element facing the first part 42A1 be parallel to the first direction. Accordingly, it is possible to increase the minimum distance between the light emitting element and the lateral wall. This structure allows for facilitating disposing of the light emitting element.

It is preferable that the second extended lower end 42S2 be located on the second lead 22 and the bottom resin part 41J. With this structure, the second part having a greater width than the first part is located on the second lead 22 and the bottom resin part 41J, so that it is possible to improve the strength of the light emitting device. It is more preferable that the second extended lower end 42S2 be located on the first lead 21, the second lead 22, and the bottom resin part 41J. With this structure, it is possible to further improve the strength of the light emitting device.

It is preferable that in the second direction, the width w2 of the second part at the lower end 42K2 be 1.1 times or greater to 3 times or less the width w1 of the first part at the lower end 42K1. With the width w2 of the second part at the lower end 42K2 being 1.1 times or greater the width w1 of the first part at the lower end 42K2, it is possible to improve the strength of the light emitting device. With the width w2 of the second part at the lower end 42K2 being 3 times or less the width w1 of the first part at the lower end 42K2, the surface area of the second lead exposed from the resin part is increased, which facilitates manufacturing of the light emitting device. For example, disposing wires, protective element, etc., on the second lead can be facilitated.

As shown in FIG. 1A, it is preferable that an upper end 42T1 of the first part located on the inner lateral surface and an upper end 42T2 of the second part located on the inner lateral surface extend in the first direction. With this structure, it is possible to increase the size of the opening of the resin package, so that the light extraction efficiency of the light emitting device can be improved. Also, it is preferable that the upper end 42T1 of the first part located on the inner lateral surface and the upper end 42T2 of the second part located on the inner lateral surface be located on the same straight line in the top view. With this structure, it is possible to increase the size of the opening of the resin package, so that the light extraction efficiency of the light emitting device can be improved. When the upper end 42T1 of the first part located on the inner lateral surface and the upper end 42T2 of the second part located on the inner lateral surface are located on the same straight line in the top view, the width of the upper surface of the first part and the width of the upper surface of the second part are the same in the second direction. The upper end 42T1 of the first part and the upper end 42T2 of the second part are located on the upper surface of the lateral wall 42. In the top view, the outer lateral surface of the first part and the outer lateral surface of the second part are located in the same plane. In this specification, the expression "located on the same straight line" allows deviation within ±3°. Also, the expression "have the same width" in this specification allows deviation within ±3%.

It is preferable that an interior angle formed by the upward-facing surface 41 of the recess and the inner lateral surface of the first part 42A1 be greater than the interior angle formed by the upward-facing surface 41 of the recess and the inner lateral surface of the second part 42A2. With this structure, it is possible to increase the surface area of the first lead 21 exposed from the resin part. Increase of the surface area of the first lead 21 exposed from the resin part allows for facilitating disposing of the light emitting element on the first lead.

Figure 1D:
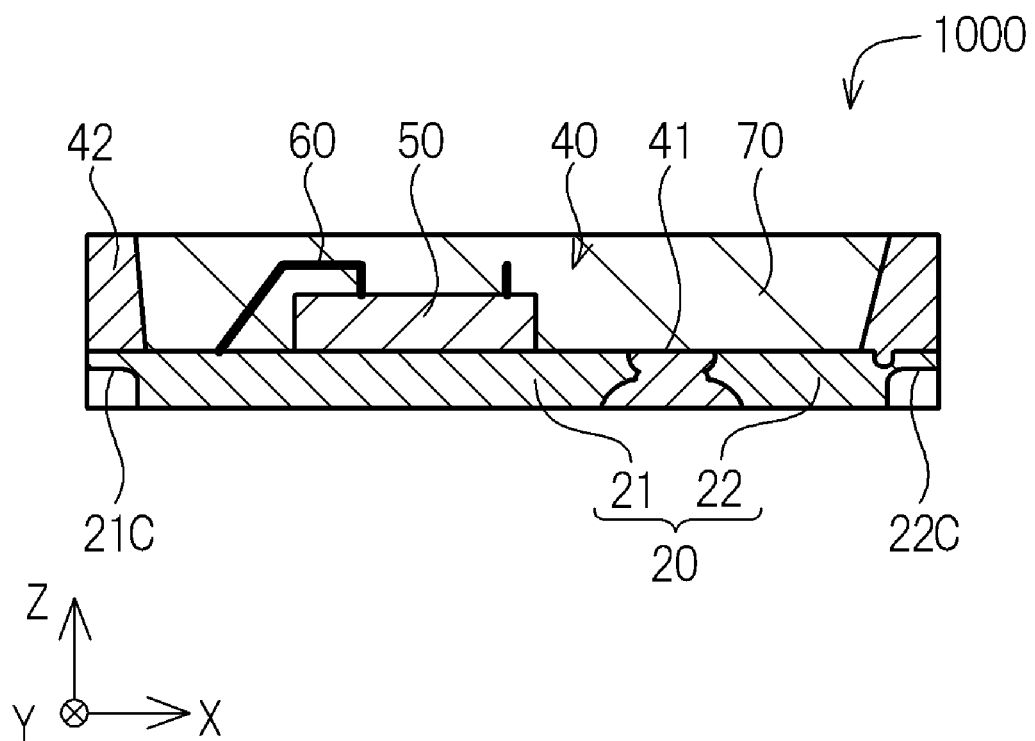
FIG. 1D is a schematic cross-sectional view taken along line 1D-1D in FIG. 1A.
Figure 2:
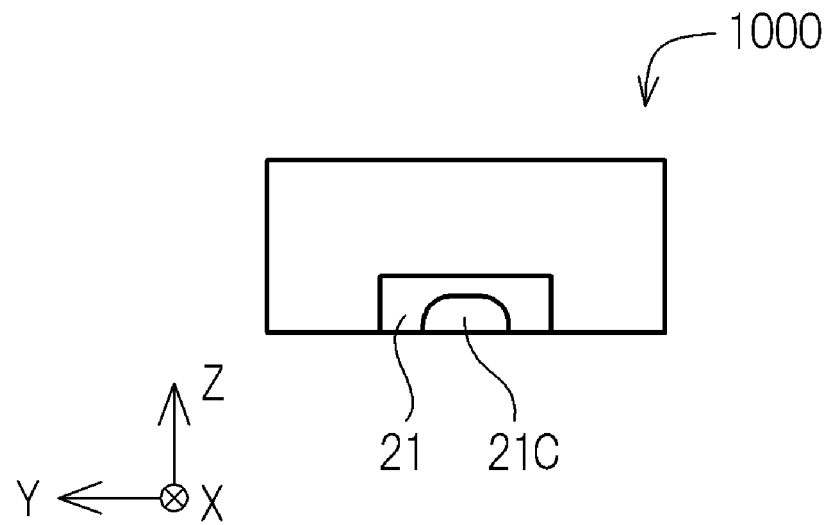
FIG. 2 is a schematic side view of the light emitting device of the first embodiment when viewed from a right side in FIG. 1A.

As shown in FIG. 1D and FIG. 2, the first lead 21 may define a first recess 21C that opens at the lower surface and the lateral surfaces of the light emitting device. The first recess 21C serves as a castellation. For example, when the light emitting device is solder-bonded to a mounting substrate, the first recess 21C allows for facilitating confirming of the melting state of the solder. The second lead 22 may also define a second recess 22C that opens at the lower surface and the lateral surfaces of the light emitting device.

Figure 3:
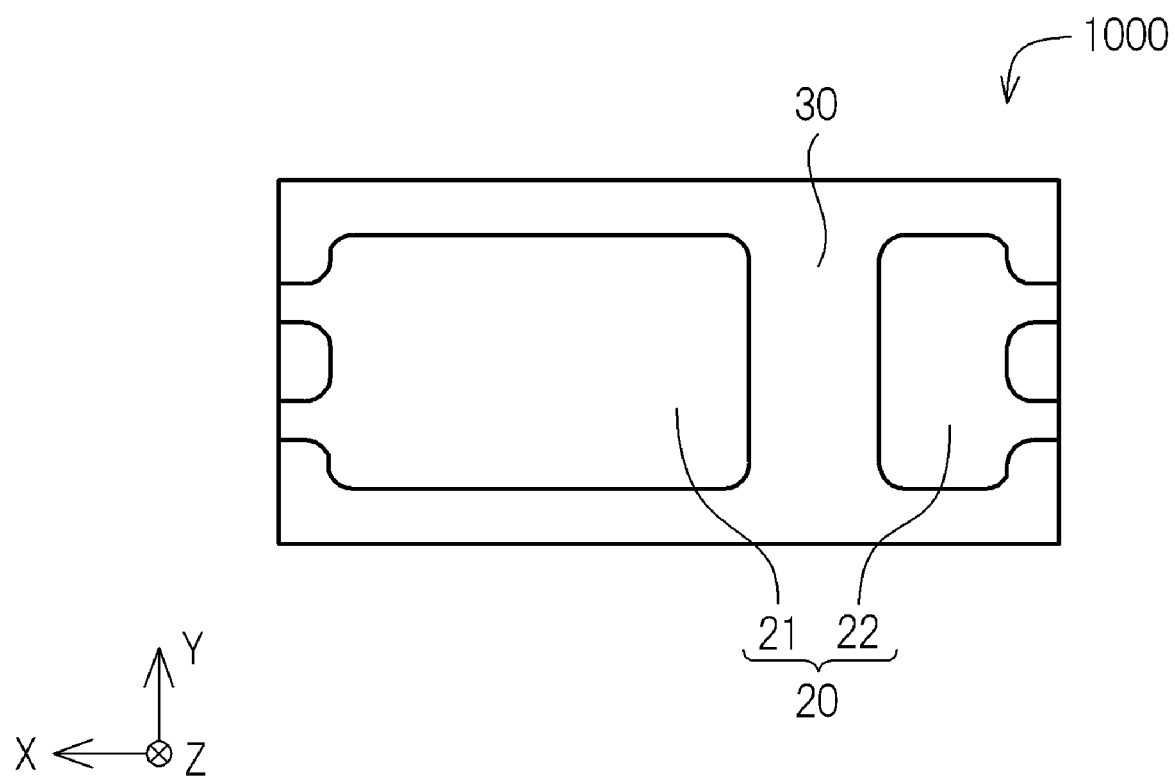
FIG. 3 is a schematic bottom view of the light emitting device of the first embodiment.

As shown in FIG. 3, the first lead 21 and the second lead 22 are preferably exposed from the resin part 30 on the lower surface of the light emitting device. With this structure, the heat from the light emitting device is more easily transmitted from the first lead 21 and the second lead 22 to the mounting substrate on which the light emitting device is mounted. Accordingly, it is possible to improve the heat dissipation of the light emitting device.

The light emitting element 50 is disposed on the first lead on the upward-facing surface of the recess. The light emitting element 50 is secured on the first lead 21 by a known bonding member. The light emitting element 50 includes positive and negative electrodes on an upper surface light emitting element 50, such that with one of the positive and negative electrodes connected to the second lead 22 by a corresponding one of wires 60, and the other of the positive and negative electrodes connected to the first lead 21 by a corresponding one of the wires 60.

The light emitting device 1000 may also include the light-transmissive covering member 70 that covers the light emitting element 50. The covering member 70 is disposed inside the recess 40, and covers the upper surface and lateral surface of the light emitting element.

The covering member 70 may also contain a phosphor. With the phosphor, color adjustment of the light emitting device can be facilitated. There may be one or a plurality of types of phosphor contained in the covering member 70. The phosphor contained in the covering member 70 may be dispersed, or may be unevenly distributed. A known material can be used for the phosphor. Examples of the phosphor include fluoride-based phosphors such as KSF-based phosphor, nitride-based phosphors such as CASN, YAG-based phosphors, and a β sialon phosphor.

KSF-based phosphor and CASN are included in examples of wavelength conversion members that convert blue light to red light, and YAG-based phosphor is included in examples of a wavelength conversion member that converts blue light to yellow light. B sialon phosphor is included in examples of a wavelength conversion member that converts blue light to green light. A quantum dot phosphor may also be used for the phosphor. Examples of a base material in which particles such as phosphor are dispersed include, a silicone resin, a modified silicone resin, an epoxy resin, a modified epoxy resin, a urea resin, a phenol resin, an acrylic resin, an urethane resin, a fluororesin, and a resin including two or more types of these resins.

Figure 4A:
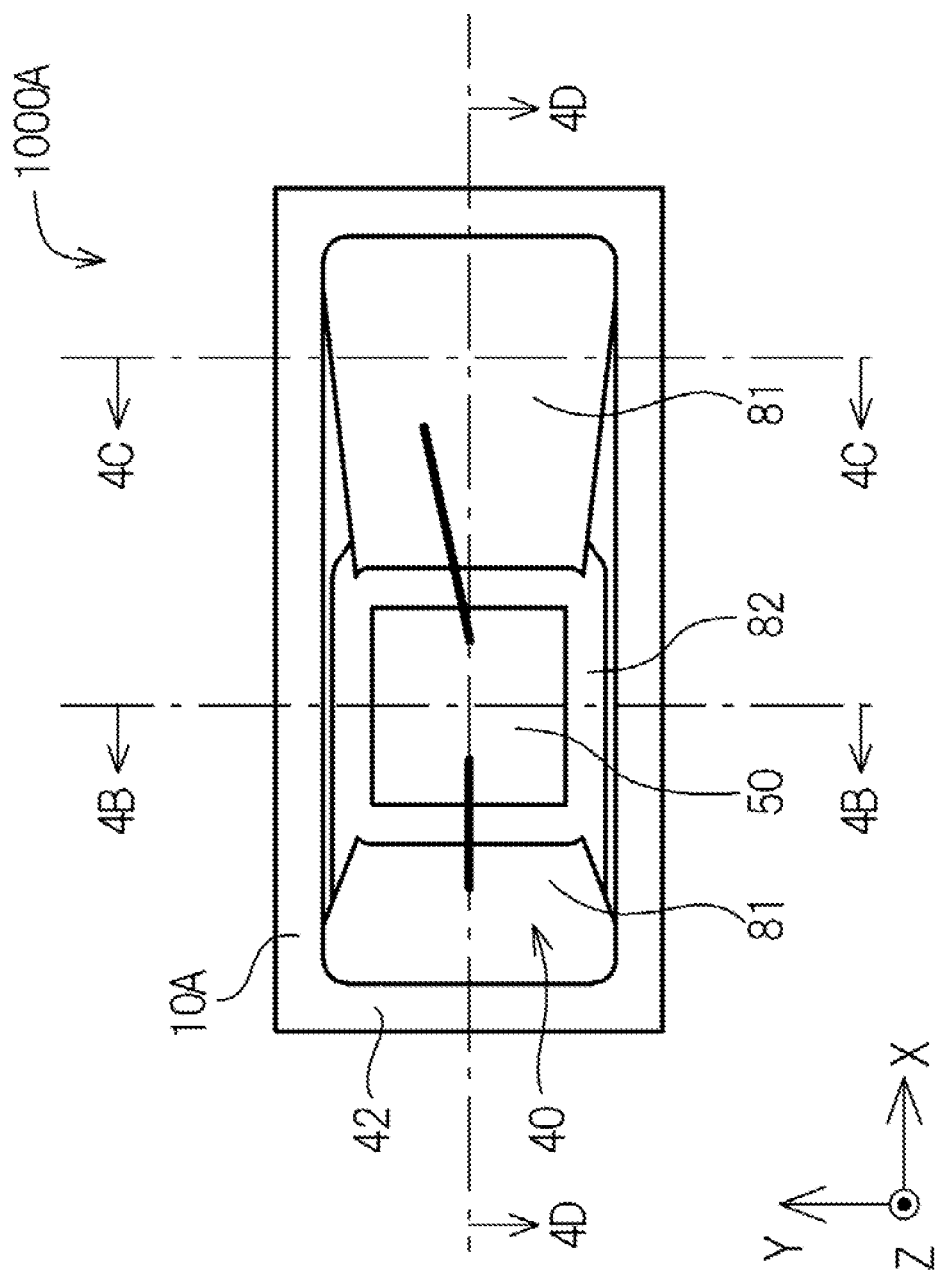
FIG. 4A is a schematic top view of Modification Example 1 of the light emitting device of the first embodiment.
Figure 4B:
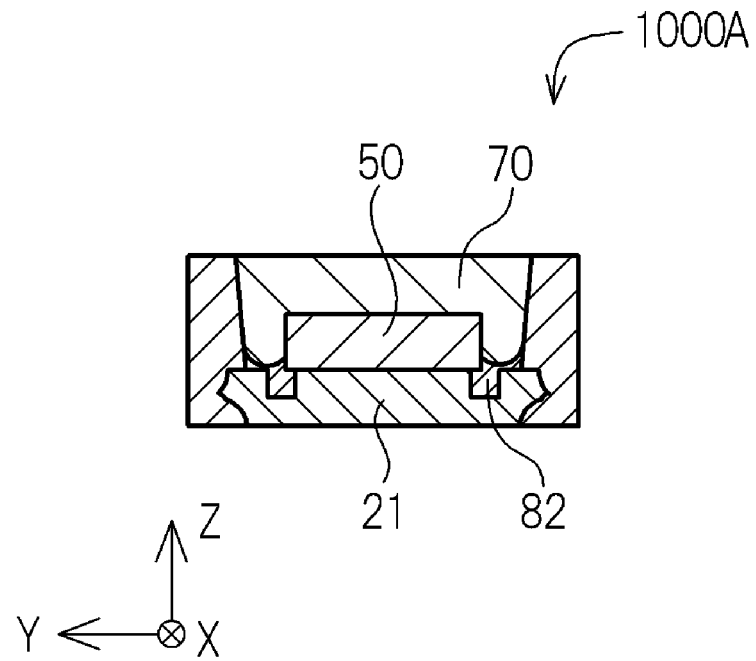
FIG. 4B is a schematic cross-sectional view taken along line 4B-4B of FIG. 4A.
Figure 4C:
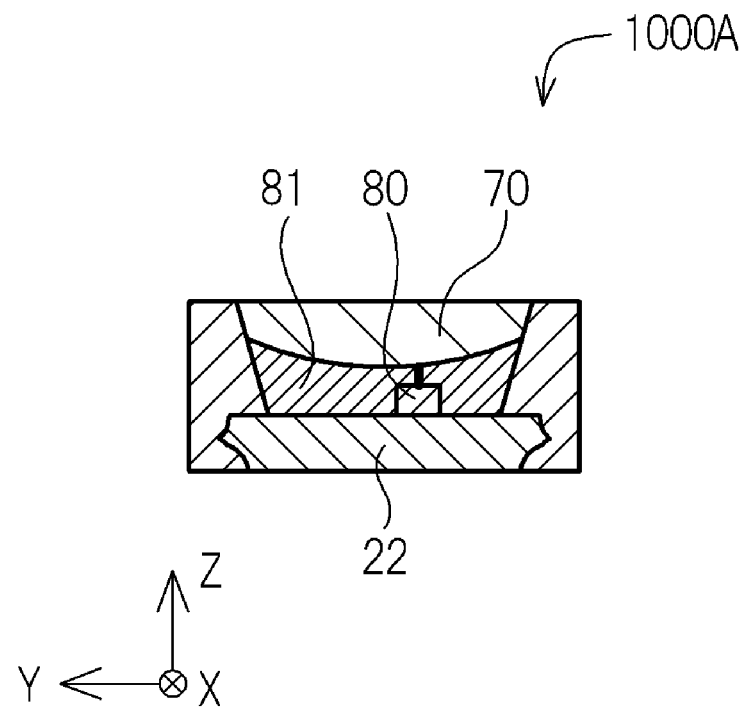
FIG. 4C is a schematic cross-sectional view taken along line 4C-4C of FIG. 4A.
Figure 4D:
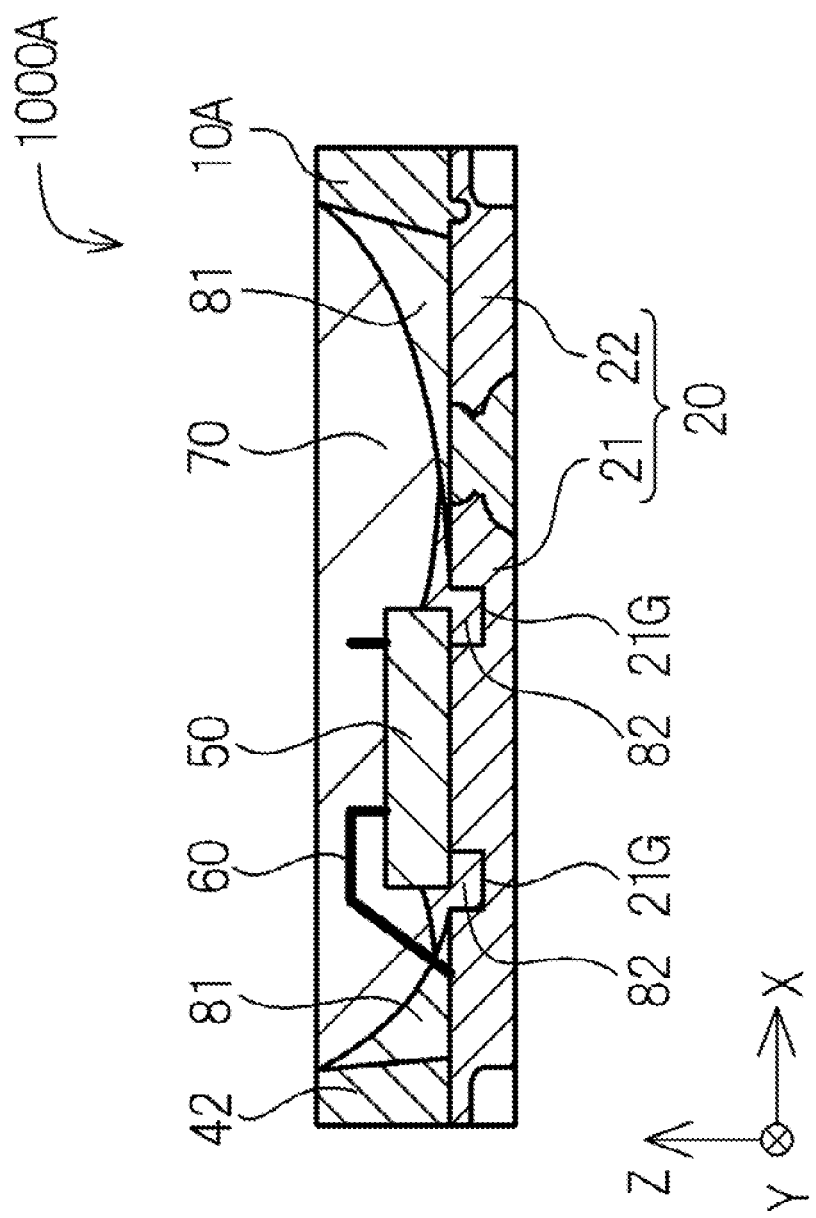
FIG. 4D is a schematic cross-sectional view taken along line 4D-4D of FIG. 4A.
Figure 5:
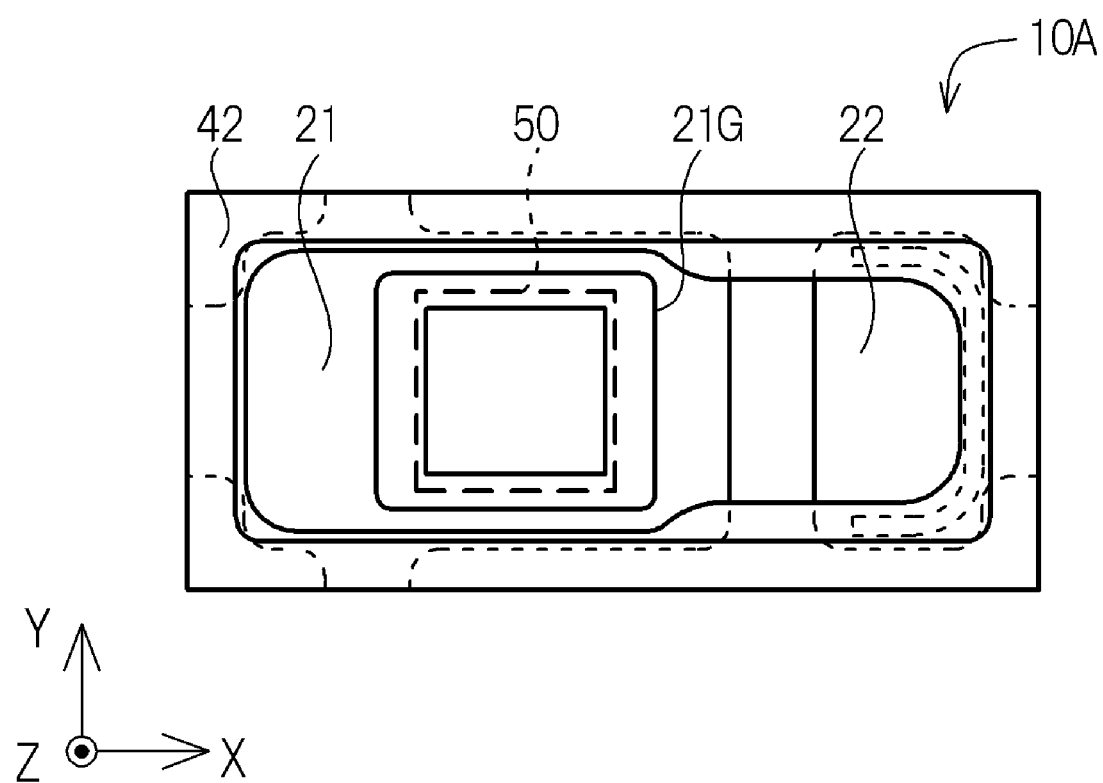
FIG. 5 is a schematic top view of a resin package of Modification Example 1.

A first reflective member 81 that covers the lateral wall 42 may be disposed in the recess as in a light emitting device 1000A shown in FIG. 4A and FIG. 4D. The first reflective member 81 may be in contact with or separated from the light emitting element 50. With the first reflective member in contact with the light emitting element, the surface area of the lead covered by the first reflective member is increased, so that it is possible to reduce the absorption of the light emitted from the light emitting element by the lead. With the first reflective member be separated from the light emitting element, light can be easily extracted from the lateral surfaces of the light emitting element. The first light reflective member may be disposed to surround the entire periphery of the light emitting element, or may be disposed such that the light emitting element is disposed between two first reflective members 81 as shown in FIG. 4A. When the light emitting element 50 is disposed between two first reflective members 81, it is preferable that the light emitting element 50 is located between the two first reflective members 81 in the first direction. With the resin package having a rectangular shape, the distance between the first short lateral wall or the second short lateral wall and the light emitting element tends to be longer than the distance between the first long lateral wall or the second long lateral wall and the light emitting element. Accordingly, when the light emitting element 50 is disposed between two first reflective members 81 in the first direction, the first reflective members 81 can be easily disposed to be separated from the light emitting element. When the first reflective members are separated from the light emitting element, it is preferable that the first lead 21 have a groove part 21G surrounding the light emitting element 50 on the upper surface the first lead 21 as shown in FIG. 4B, FIG. 4D, and FIG. 5. The groove part 21G is formed inward of the lateral wall 42, and functions as a damming part for inhibiting the first reflective members 81 from reaching the lateral surface of the light emitting element 50. The groove part 21G may surround at least a portion of the light emitting element, but preferably surrounds the entire circumference of the light emitting element. With this structure, contact between the first reflective member(s) and the light emitting element can be easily reduced. When the light emitting device includes the protective element, it is preferable that at least a portion of the protective element be covered by the first reflective member as shown in FIG. 4C. With this arrangement, it is possible to reduce the absorption of light emitted from the light emitting element by the protective element.

As in the light emitting device 1000A shown in FIG. 4A and FIG. 4D, when the first light reflective member is separated from the light emitting element, it is preferable that a second reflective member 82 that contacts the light emitting element 50 and covers the upper surface of the first lead is disposed in inside the recess. With the light emitting device including the second reflective member, the second reflective member 82 covers the upper surface of the first lead, so that it is possible to reduce the absorption of light emitted from the light emitting element by the first lead. It is preferable that the second reflective member cover a portion of the first reflective member. With this structure, it is possible to reduce the surface area of the upper surface of the first lead exposed from the first reflective member and/or the second reflective member.

When the light emitting device includes the first reflective member and the second reflective member, the thickness of the reflective member including the first reflective member and the second reflective member can be easily adjusted. For example, inside the recess, a portion of the reflective member that covers the lateral wall preferably has a thickness increased in the Z direction to facilitate the reflection of light emitted from the light emitting element. Also, a portion of the reflective member that contacts the light emitting element preferably has a thickness reduced in the Z direction so as not to reflect light emitted from the lateral surface of the light emitting element. While it is difficult to form a single reflective member having a thicker part and a thinner part, it is easy to form two reflective members including a thicker reflective member and a thinner reflective member. In the recess, after forming the first reflective member to have a greater thickness to cover the lateral wall separated from the light emitting element, the second reflective member can be formed to have a smaller thickness to cover the upper surface of the first lead so as to be in contact with the light emitting element. Thus, the reflective member can be formed to have a desired thickness.

When the second reflective member contains a resin material and light reflective particles contained in the resin material, the light reflective particles contained in the resin material are preferably predominantly distributed to the lead side. In other words, it is preferable that the concentration of light reflective particles at a lower portion of the second reflective member, located at a lead side of the second reflective member, be higher than the concentration of light reflective particles at an upper portion of the second reflective member, located at an opening side of the second reflective member. With this structure, the lower part of the second reflective member has a high concentration of light reflective particles, so that it is possible to reduce the absorption of light emitted from the light emitting element by the first lead. Also, the upper portion of the second reflective member has a low concentration of light reflective particles, which can facilitate the extraction of light from the lateral surfaces of the light emitting element. A known method can be used to distribute the light reflective particles predominantly at the lead side in the resin material. For example, forced sedimentation, such as centrifugal sedimentation, or plain sedimentation may be employed.

When the light emitting device 1000A includes the second reflective member 82 as shown in FIG. 4B and FIG. 4D, it is preferable that the first lead have the groove part 21G surrounding the light emitting element on the upper surface of the first lead, and that the second reflective member 82 be disposed inside the groove part 21G. With the second reflective member disposed inside the groove part, adhesion between the second reflective member and the first lead can be improved.

As shown in FIG. 4B, FIG. 4D, and FIG. 5, it is preferable that a portion of the groove part 21G overlap the light emitting element 50 in a top plan view. With this arrangement, for example, the first reflective member that is separated from the light emitting element can be formed to extend to the vicinity of the light emitting element. Also, with a portion of the groove part overlapping the light emitting element, the second reflective member does not easily creep up the lateral surface of the light emitting element, which allows for facilitating the extraction of light from the lateral surfaces of the light emitting element. It is preferable that a portion of the groove part overlap the light emitting element, that the second reflective member be located inside the groove part, and that the light reflective particles of the second reflective member 82 be distributed predominantly at the lead side. With this structure, in the second reflective member, the concentration of light reflective particles is higher inside the groove part, and the light reflective particles of the second reflective member in contact with the lateral surface of the light emitting element is contained at a lower concentration than the light reflective particles inside the groove part, which allows for facilitating the extraction of light from the lateral surface of the light emitting element. When the light reflective particles of the second reflective member inside the groove part are distributed predominantly at the lead side, the concentration of light reflective particles at a lower part of the groove part, located at a bottom surface side of the groove part, is higher than the concentration of light reflective particles at an upper part of the groove part, located at an opening side of the groove part.

Figure 6A:
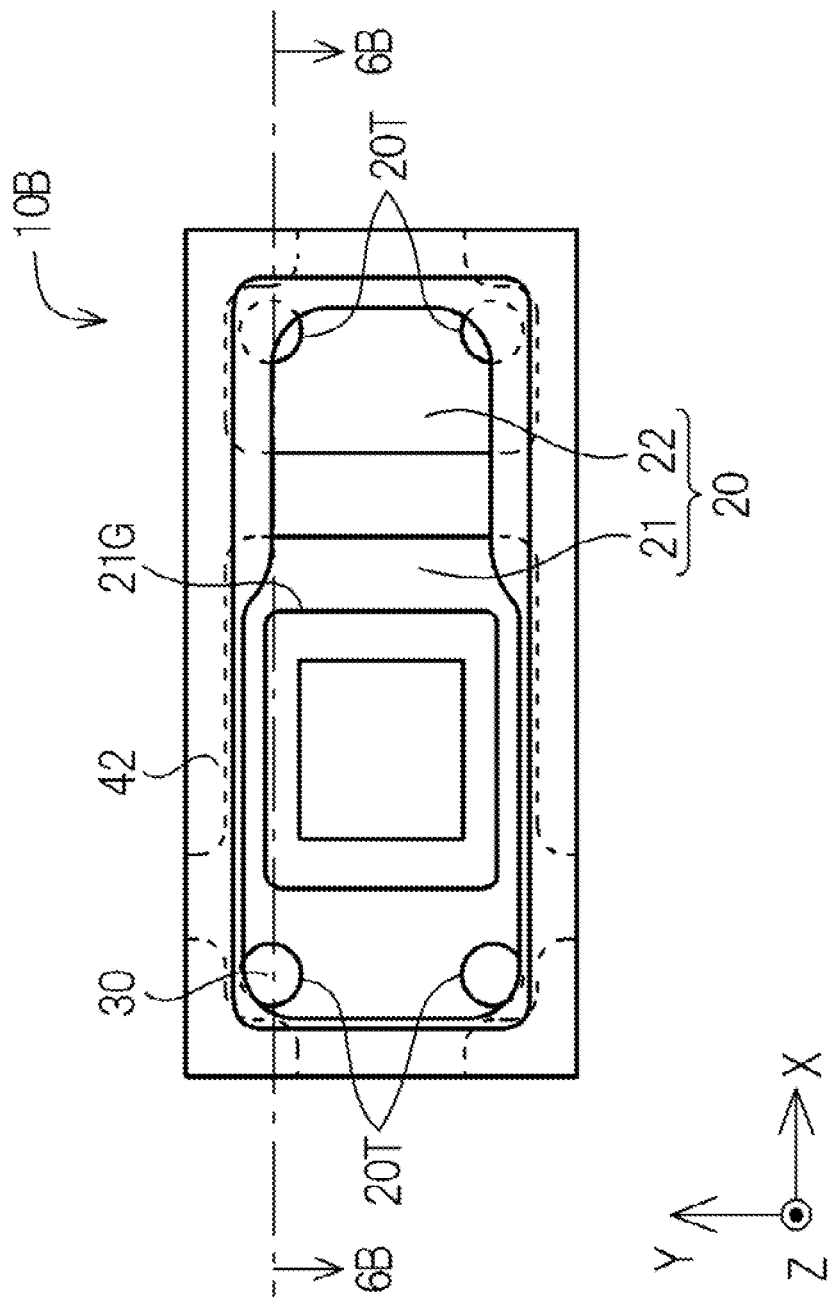
FIG. 6A is a schematic top view of the resin package of Modification Example 2.
Figure 6B:
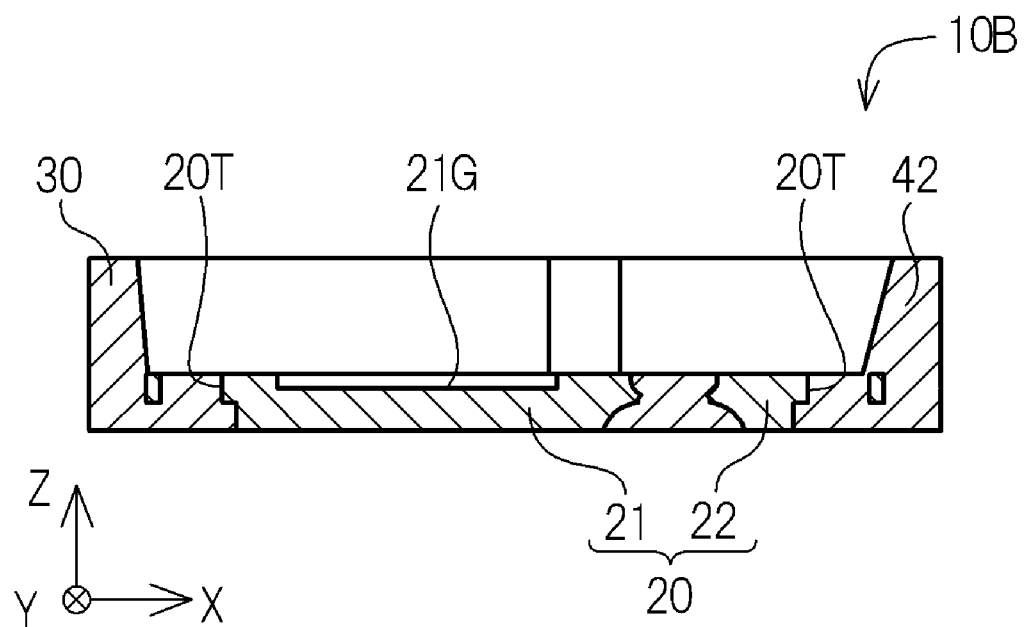
FIG. 6B is a schematic cross-sectional view taken along line 6B-6B of FIG. 6A.

As in a resin package 10B shown in FIG. 6A and FIG. 6B, the first lead 21 and/or the second lead 22 has a through hole 20T, and a portion of the resin part 30 may be disposed inside the through hole 20T. With this structure, it is possible to improve the adhesion between the first lead 21 and/or the second lead 22 and the resin part 30. This allows for reducing the entry of moisture or the like into the resin package from between the first lead and/or the second lead and the resin part 30. It is preferable that the through hole 20T overlap the lateral wall 42 in a top plan view. With this structure, the resin part can be easily filled inside the through hole. While the first lead 21 and/or the second lead 22 may have any appropriate number of through holes, it is preferable to have a plurality of through holes. When having a plurality of through holes, it is preferable to have through holes each defined at a respective one of the four corners of the resin package. With this structure, it is possible to improve adhesion between the first lead and/or the second lead and the resin part.

Figure 7A:
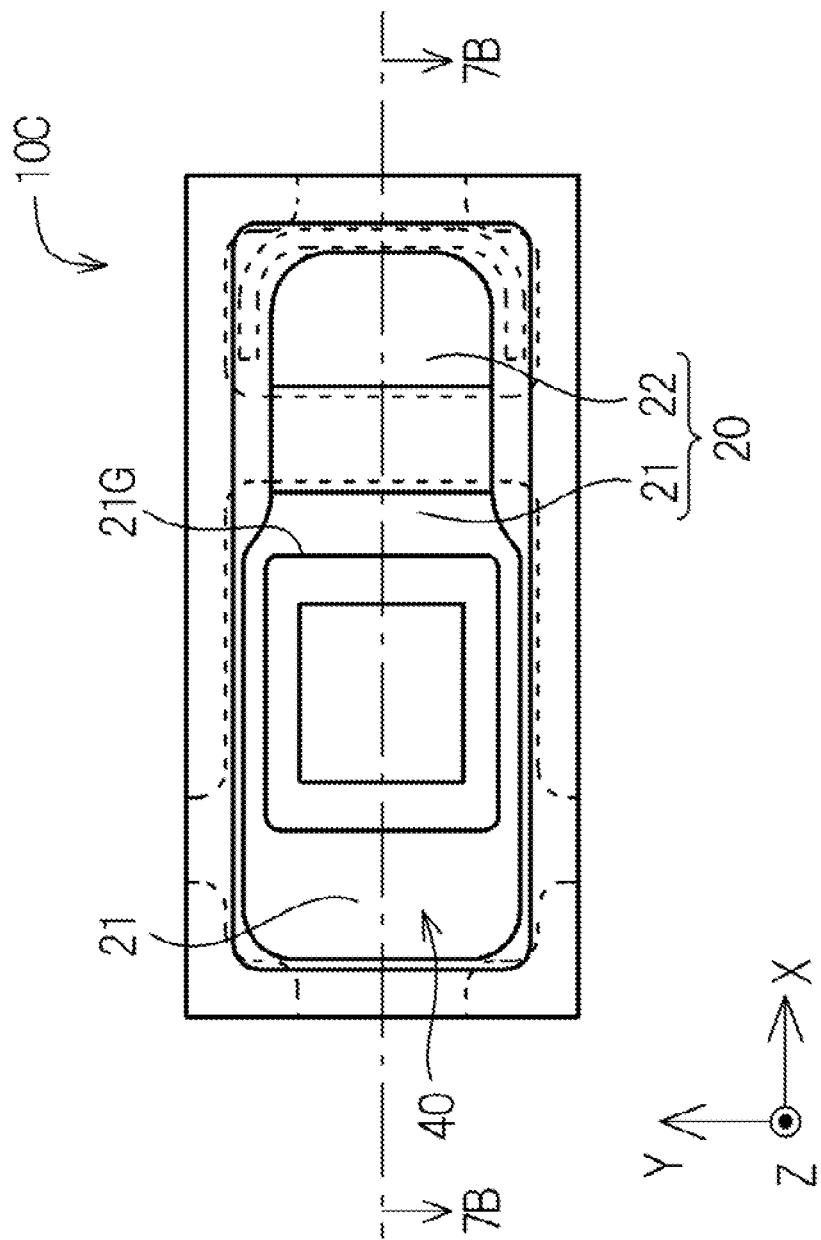
FIG. 7A is a schematic top view of the resin package of Modification Example 3.
Figure 7B:
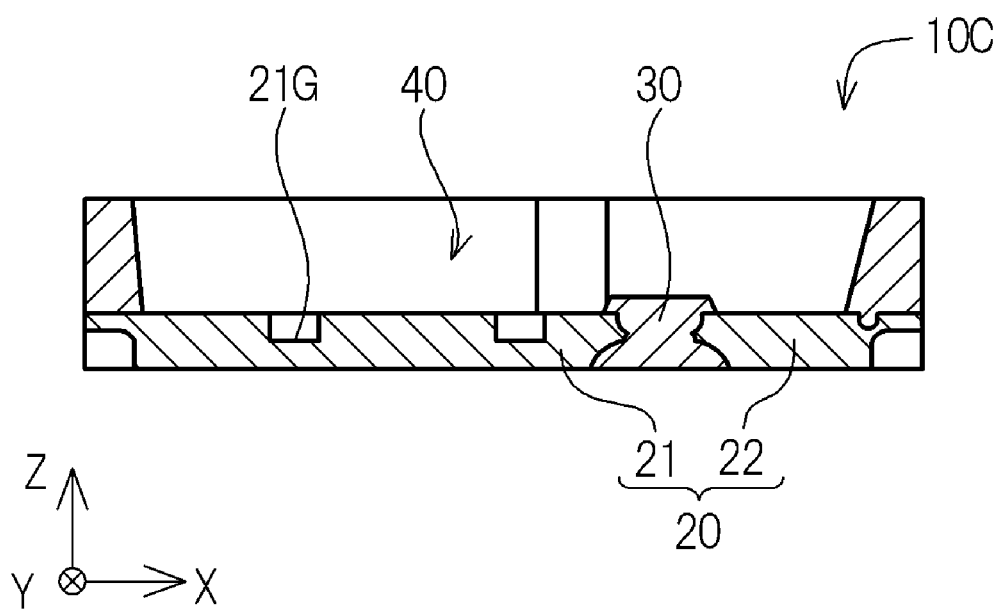
FIG. 7B is a schematic cross-sectional view taken along line 7B-7B of FIG. 7A.

As in a resin package 10C shown in FIG. 7A and FIG. 7B, the resin part 30 inside the recess may cover a portion of the upper surface of the first lead and/or the upper surface of the second lead. With this structure, it is possible to improve the adhesion between the first lead and/or the second lead and the resin part.

SECOND EMBODIMENT

Light emitting devices 2000A, 2000B, 2000C, 2000A1, 2000A2, 2000A3, 2000B1, and 2000C1 of the second embodiment of the present invention are described with reference to FIG. 8A to FIG. 14. To show the internal structure, the covering member 70 is transparently shown in FIG. 8A, FIG. 9A, FIG. 10A, and FIG. 11A.

The light emitting device 2000A includes a resin package 10D, a light emitting element 50, and wires 60. The resin package 10D includes leads 20 and a resin part 30. The leads 20 includes a first lead 21 and a second lead 22. In a top view, the resin package 10D has a rectangular shape. The resin package 10D defines a recess 40 defined by an upward-facing surface 41 and a lateral wall 42. The upward-facing surface 41 defines a bottom of the recess 40, and includes an upper surface of a portion of the first lead 21, an upper surface of a portion of the second lead 22, and an upper surface of a portion of the resin part 30. The lateral wall 42 includes a portion of the resin part 30. In a top view, the lateral wall 42 includes a first long lateral wall 42A and a second long lateral wall 42B facing each other and extending in a first direction, and a first short lateral wall 42C and a second short lateral wall 42D facing each other and extending in a second direction orthogonal to the first direction. The resin part 30 includes a holding resin portion 41H disposed between the first lead 21 and the second lead 22 at the upward-facing surface 41 of the recess 40, and a covering resin portion 41C that covers a portion of an upper surface of the holding resin portion 41H, and at least one of a portion of an upper surface of the first lead 21 and a portion of an upper surface of the second lead 22. A portion of an upper surface of the holding resin portion 41H is exposed from the covering resin portion 41C, and the exposed portion of the upper surface of the holding resin portion 41H exposed from the covering resin portion 41C is located in the same plane as the upper surface of the first lead 21 and the upper surface of the second lead 22. The light emitting element 50 is disposed on the first lead 21 on the upward-facing surface 41 of the recess 40. One of the wires 60 electrically connects the light emitting element 50 and the second lead 22. The expression "located in the same plane" in this specification allows deviation within ±10 μm.

The light emitting device 2000A of the second embodiment is different from the light emitting device of the first embodiment in that the resin part 30 includes the holding resin portion 41H located between the first lead 21 and the second lead 22 at the upward-facing surface 41 of the recess 40, and the covering resin portion 41C that covers a portion of the upper surface of the holding resin portion 41H and at least one of the first lead 21 and the second lead 22, a portion of the upper surface of the holding resin portion 41H is exposed from the covering resin portion 41C, and the upper surface of the holding resin portion 41 exposed from the covering resin portion 41C is in the same plane as the upper surface of the first lead 21 and the upper surface of the second lead 22. In the light emitting device of the second embodiment configured as described above, including the covering resin portion 41C increases a thickness of the resin part 30 by the thickness of the covering resin portion 41C. Increase in thickness of the resin part allows for increasing strength of the resin part 30. Accordingly, a light emitting device with high strength can be obtained.

The holding resin portion 41H is a portion of the resin part 30 located between the first lead 21 and the second lead 22 at the upward-facing surface 41 of the recess 40, and located at the lower side in a third direction from the upper surface of the first lead 21 and the second lead 22. The third direction (Z axis direction) refers to a direction orthogonal to the first direction (X axis direction) and the second direction (Y axis direction). A portion of the resin part located in the same plane as the upper surface of the first lead 21 and the upper surface of the second lead 22 on the upward-facing surface of the recess is included in the holding resin portion 41H. The upper surface of the first lead 21 refers to a surface of the first lead located at the uppermost part in the third direction. Similarly, the upper surface of the second lead 22 refers to a surface of the second lead located at the uppermost part in the third direction.

The covering resin portion 41C is a portion of the resin part 30 covering a portion of the upper surface of the holding resin portion 41H and at least one of the first lead 21 and the second lead 22 and located above the upper surface of the first lead 21 and the upper surface of the second lead 22 in the third direction (Z axis direction).

Figure 8A:
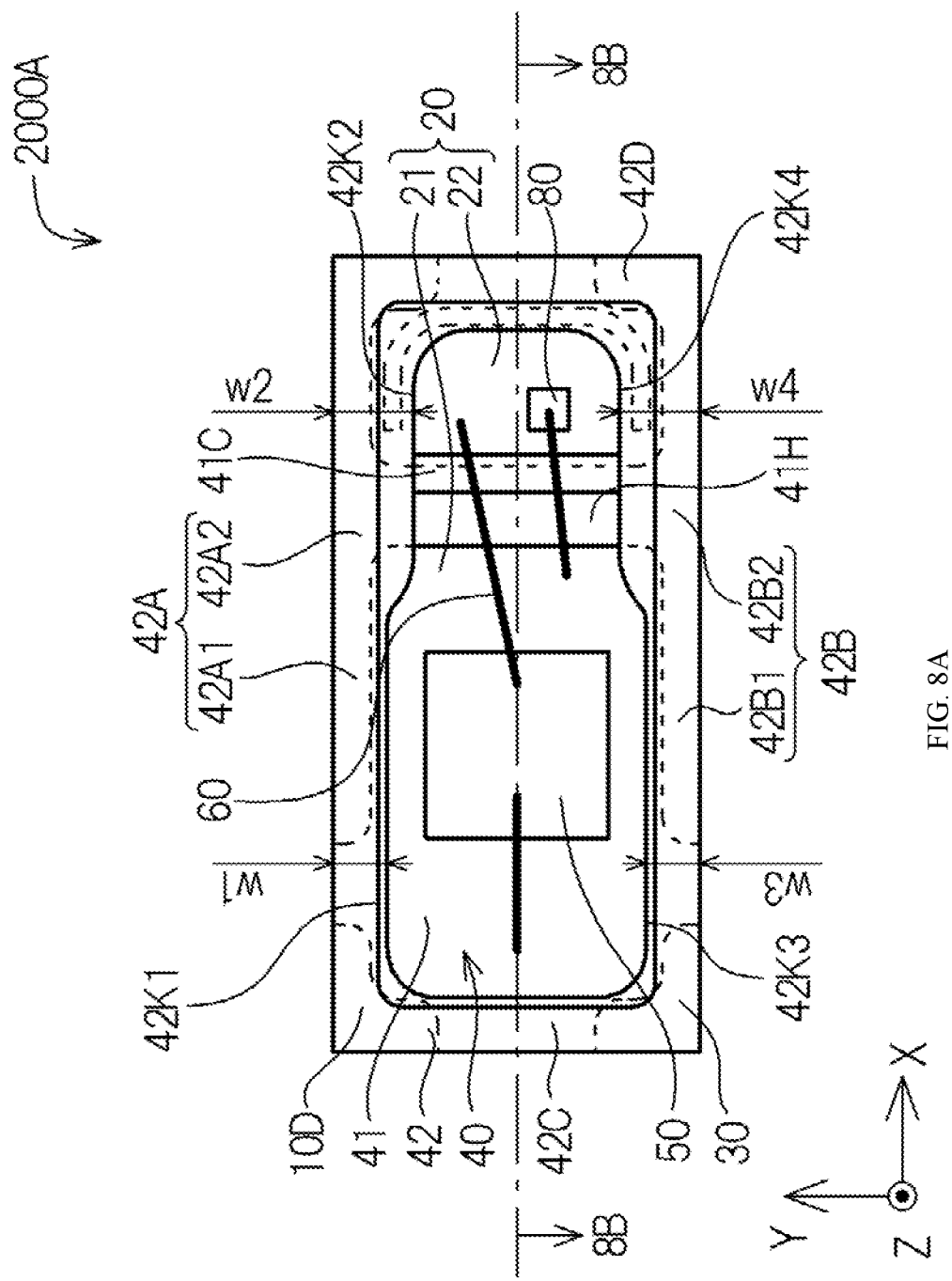
FIG. 8A is a schematic top view of the light emitting device of a second embodiment.
Figure 8B:
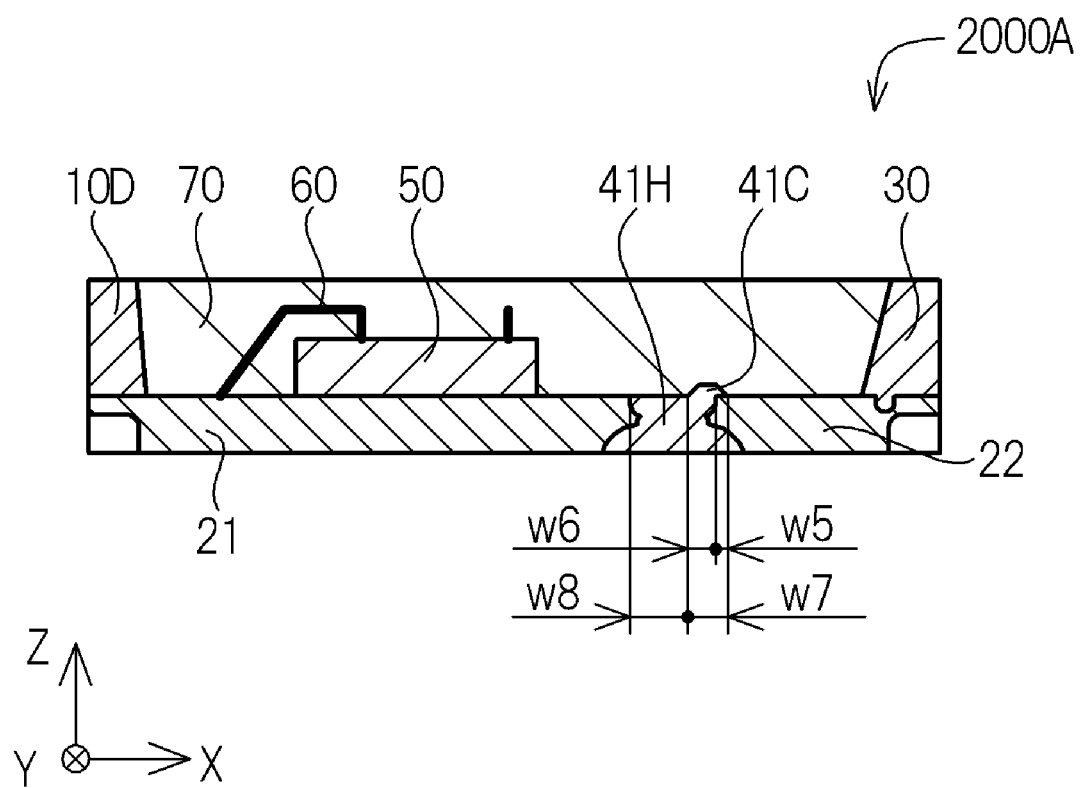
FIG. 8B is a schematic cross-sectional view taken along line 8B-8B of FIG. 8A.

As in the light emitting device 2000A shown in FIG. 8A and FIG. 8B, the covering resin portion 41C may also cover the upper surface of the holding resin portion 41H and the second lead 22, and may be separated from the upper surface of the first lead 21. With the covering resin portion 41C separated from the upper surface of the first lead 21, it is possible to increase the surface area of the upper surface of the first lead 21 exposed from the resin part 30. Increase of the surface area of the upper surface of the first lead 21 exposed from the resin part 30 allows for increasing the size of the light emitting element 50, so that it is possible to improve the light output of the light emitting device. Also, increase of the surface area of the upper surface of the first lead 21 exposed from the resin part 30 allows for facilitating disposing of the light emitting element 50. When including a wire connecting the protective element 80 disposed on the second lead 22 and the first lead 21, increase of the surface area of the upper surface of the first lead 21 exposed from the resin part 30 allows for facilitating disposing the wire on the first lead 21. Likewise, when disposing the light emitting element on the second lead 22, a wire that electrically connects the light emitting element on the second lead 22 and the first lead 21 can be easily disposed on the first lead 21.

Figure 9A:
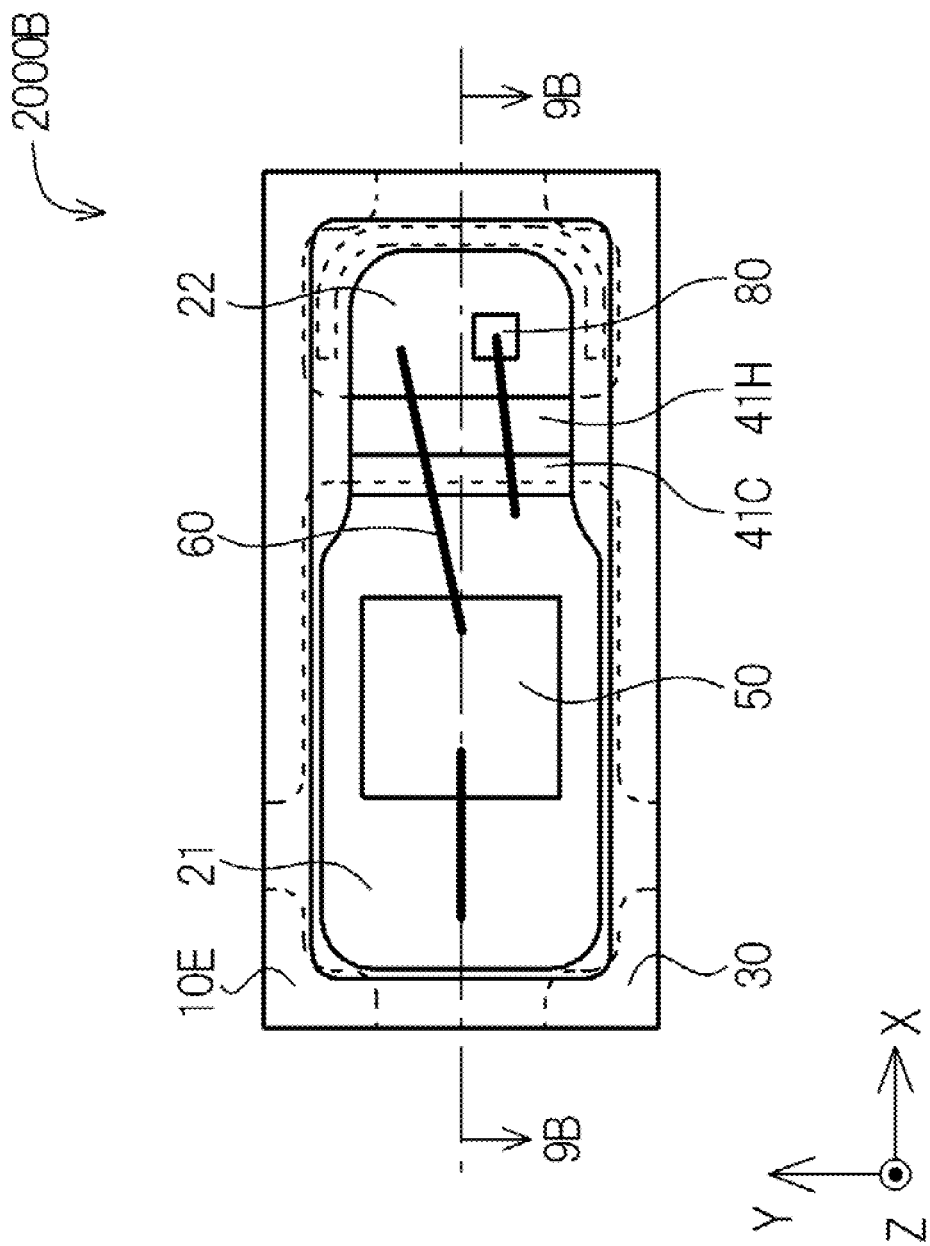
FIG. 9A is a schematic top view of Modification Example 4 of the light emitting device of the second embodiment.
Figure 9B:
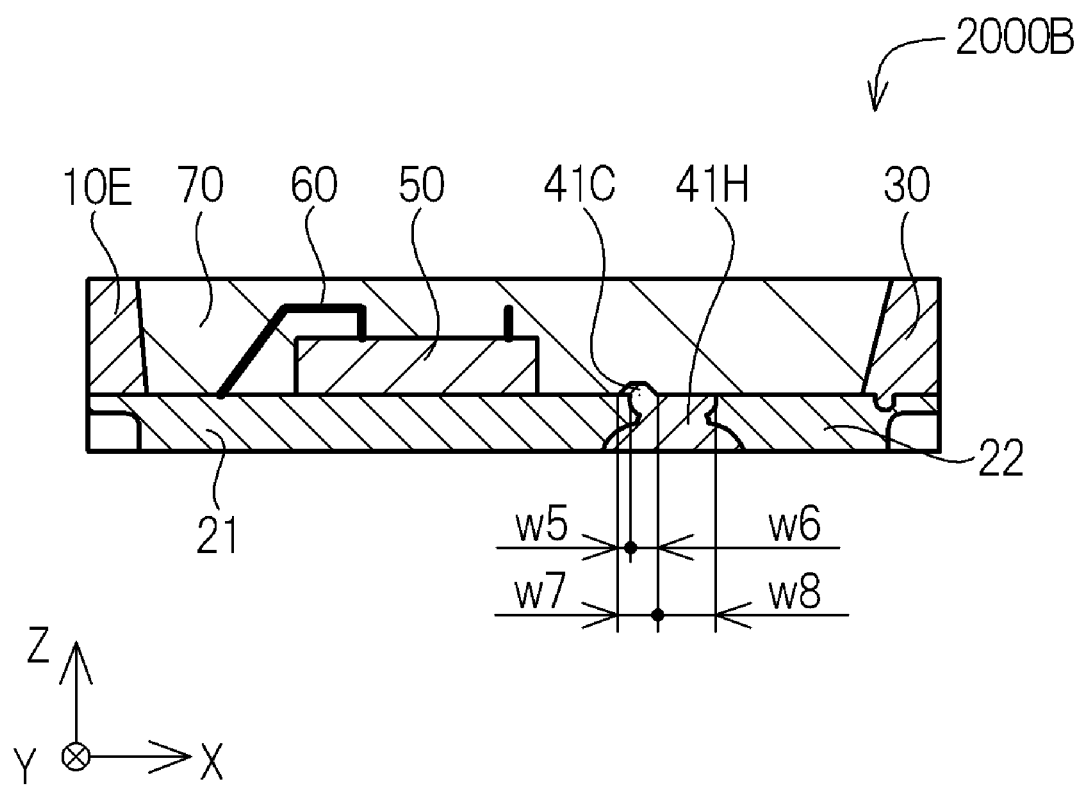
FIG. 9B is a schematic cross-sectional view taken along line 9B-9B of FIG. 9A.

As in the light emitting device 2000B shown in FIG. 9A and FIG. 9B, the covering resin portion 41C may also cover a portion of the upper surface of the holding resin portion 41H and the first lead 21, and may be separated from the upper surface of the second lead 22. With the covering resin portion 41C separated from the upper surface of the second lead 22, it is possible to increase the surface area of the upper surface of the second lead 22 exposed from the resin part 30. With increase of the surface area of the upper surface of the second lead 22 exposed from the resin part 30, the wire 60 that electrically connects the light emitting element 50 and the second lead 22 can be easily disposed on the second lead 22. When the protective element 80 and/or the light emitting element are disposed on the second lead 22, increase of the surface area of the upper surface of the second lead exposed from the resin part allows for facilitating disposing of the protective element 80 and/or the light emitting element.

Figure 10A:
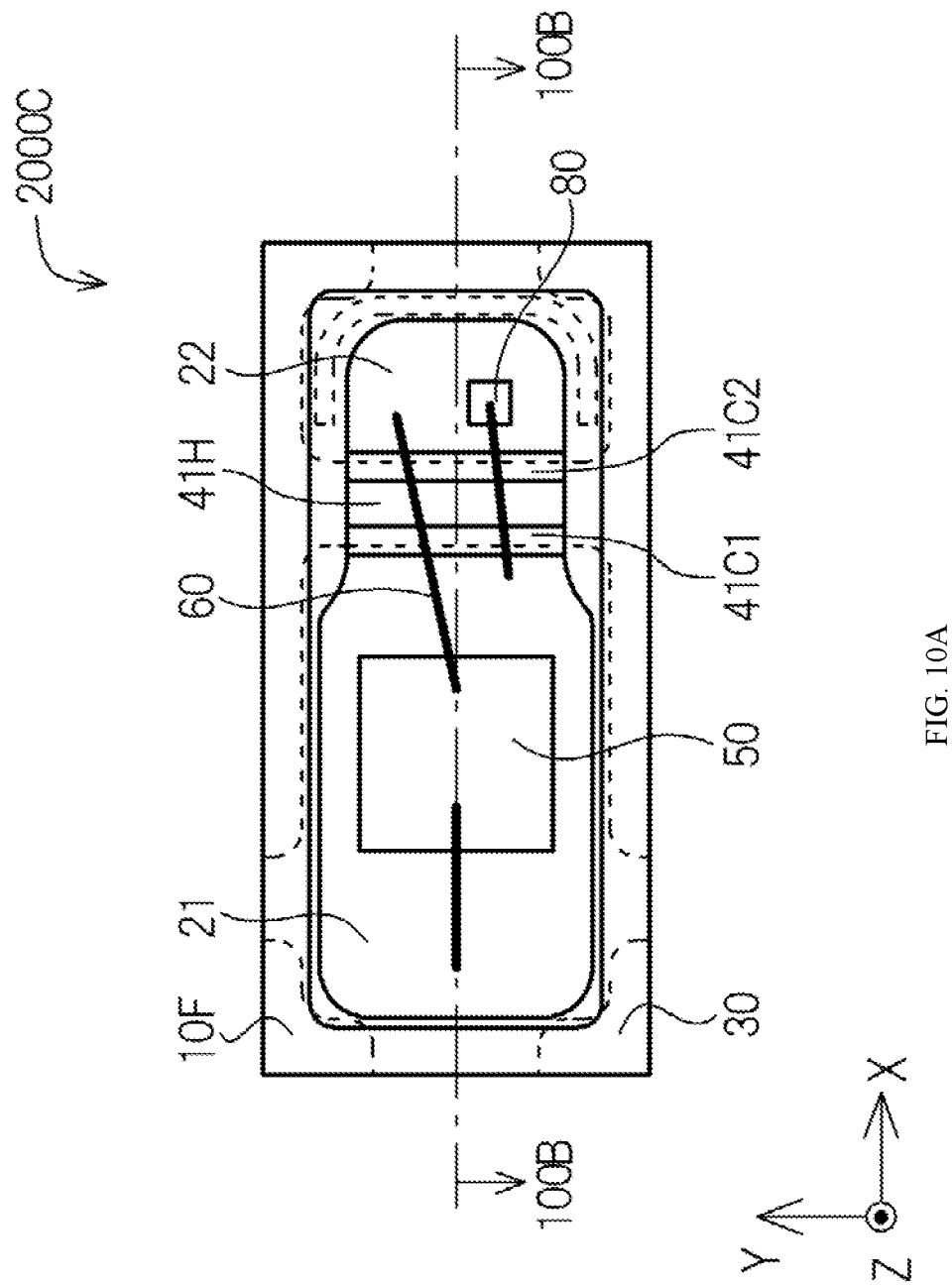
FIG. 10A is a schematic top view of Modification Example 5 of the light emitting device of the second embodiment.
Figure 10B:
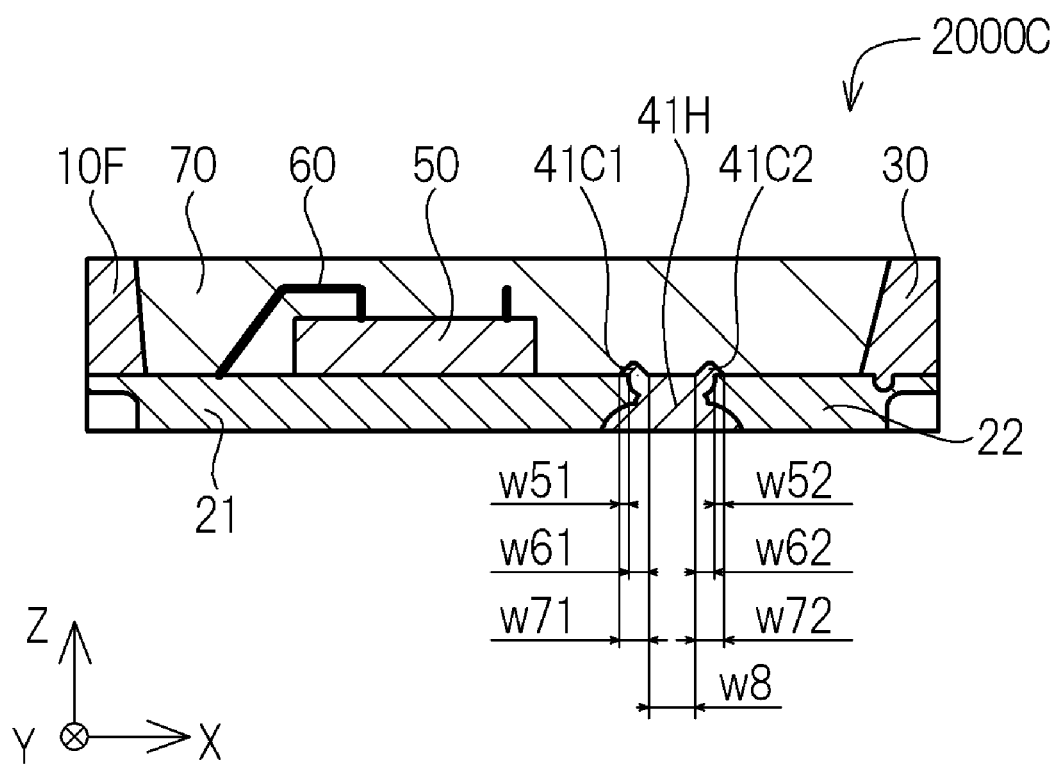
FIG. 10B is a schematic cross-sectional view taken along line 100B-100B of FIG. 10A.

As in the light emitting device 2000C shown in FIG. 10A and FIG. 10B, the covering resin portion 41C may include a first covering resin portion 41C1 and a second covering resin portion 41C2. The first covering resin portion 41C1 covers a portion of the upper surface of the holding resin portion 41H and a portion of the upper surface of the first lead 21. The second covering resin portion 41C2 covers a portion of the upper surface of the holding resin portion 41H and a portion of the upper surface of the second lead 22. The holding resin portion 41H exposed from the covering resin portion 41C is located between the first covering resin portion 41C1 and the second covering resin portion 41C2, and the upper surface of the holding resin portion 41H is located in the same plane as the upper surface of the first lead 21 and the upper surface of the second lead 22. In the light emitting device 2000C, including the first covering resin portion 41C1 and the second covering resin portion 41C2 can increase a thickness of the resin part 30 by a thickness of the first covering resin portion 41C1 and the second covering resin portion 41C2. Increase of the resin part allows for improving the strength of the resin part 30. Accordingly, a light emitting device with high strength can be obtained. Also, with the upper surface of the holding resin portion being located in the same plane as the upper surface of the first lead and the second lead, it is possible to reduce a decrease in strength of the resin part compared to when the upper surface of the resin part is located below the upper surface of the first lead and the second lead. Also, with the covering resin portion 41C including the first covering resin portion 41C1 and the second covering resin portion 41C2, the contact area between the covering member 70 and the resin part 30 increases, so that it is possible to improve adhesion between the covering member 70 and the resin part 30. Also, when the light emitting device includes the first reflective member that contacts the first covering resin portion and/or the second covering resin portion, the contact area between the first reflective member and the resin part increases, so that it is possible to improve adhesion between the first reflective member and the resin part.

In the first direction as shown in FIG. 8B and FIG. 9B, a portion of the covering resin portion 41C that covers a portion of the upper surface of at least one of the first lead 21 and the second lead 22 preferably has a width w5 smaller than a width w6 of a portion of the covering resin portion 41C that covers the holding resin portion 41H. With a smaller width w5 of a portion of the covering resin portion 41C that covers a portion of the upper surface of at least one of the first lead 21 and the second lead 22, it is possible to increase the surface area of the upper surface of the first lead 21/and/or the second lead 22 exposed from the resin part.

Also, with a greater width w6 of a portion of the covering resin portion that covers the holding resin portion, it is possible to increase the surface area of the resin part 30 that has a width increased due to covering by the covering resin portion. This allows for improving the strength of the resin part 30. Also, as shown in FIG. 10B, when the covering resin portion 41C includes the first covering resin portion 41C1 that covers a portion of the upper surface of the first lead 21 and the second covering resin portion 41C2 that covers a portion of the upper surface of the second lead 22, it is preferable that, in the first direction, a width w51 of a portion of the first covering resin portion 41C1 that covers a portion of the first lead 21 upper surface be shorter than a width w61 of a portion of the first covering resin portion that covers the holding resin portion 41H. Similarly, a portion of the second covering resin portion 41C2 that covers a portion of the upper surface of the second lead 22 preferably has a width w52 smaller than a width w62 of a portion of the second covering resin portion that covers the holding resin portion 41H. With this structure, it is possible to increase the surface area of the resin part 30 that has a thickness increased due to covering by the first covering resin portion and the second covering resin portion while increasing the surface area of the upper surface of the first lead 21 and/or the second lead 22 exposed from the resin part 30.

As shown in FIG. 8B and FIG. 9B, it is preferable that a width w7 of the covering resin portion 41C in the first direction be shorter than a width w8 of the holding resin portion 41H exposed from the covering resin portion 41C. With a smaller width w7 of the holding resin portion 41C, it is possible to increase the degree of freedom of the loop shape of the wire that is separated from the covering resin portion 41C and that extends in a bridge manner across the covering resin portion 41C. In other words, with a smaller width w7 of the covering resin portion 41C, it is possible to reduce contact of the wire that straddles the covering resin portion 41C to the covering resin portion by. This allows for preventing the breaking of the wire. Also, as shown in FIG. 10B, when the covering resin portion 41C includes the first covering resin portion 41C1 that covers a portion of the upper surface of the first lead 21 and the second covering resin portion 41C2 that covers a portion of the upper surface of the second lead 22, it is preferable that, in the first direction, the first covering resin portion 41C1 has a width w71 smaller than the width w8 of the holding resin portion 41H exposed from the covering resin portion 41C. With a small width w71 of the first covering resin portion 41C1, it is possible to increase the degree of freedom of the loop shape of the wire that is separated from the first covering resin portion 41C1 and that extends in a bridge manner across the first covering resin portion 41C1. Similarly, in the first direction, it is preferable that the second covering resin portion 41C2 has a width w72 smaller than the width w8 of the holding resin portion 41H exposed from the covering resin portion 41C.

As shown in FIG. 8A, it is preferable that the covering resin portion 41C connect the first long lateral wall 42A and the second long lateral wall 42B. This allows for improving the strength of the resin part 30 between the first long lateral wall and the second long lateral wall.

As shown in FIG. 8B, it is preferable that a height of the covering resin portion 41C be smaller than a height of the light emitting element 50. This allows for reducing the occurrence of contact between the wire 60 and the covering resin portion 41C even when the wire 60 that electrically connects the light emitting element 50 and the second lead 22 is disposed across the covering resin portion 41C. The expression "a height of the covering resin portion 41C" refers to the maximum distance between the upper surface of the first lead and the upper surface of the covering resin portion in the third direction (Z axis direction). Also, the expression "a height of the light emitting element" refers to the maximum distance between the upper surface of the first lead and the upper surface of the light emitting element in the third direction (Z axis direction).

As in the light emitting device of the first embodiment, in the light emitting device 2000A of the second embodiment, it is preferable that the first long lateral wall 42A includes the first part 42A1 located on the first lead 21, and the second part 42A2 located on the first lead and the second lead, in the second direction, the width w2 of the second part at the lower end 42K2 of the second part 42A2 be greater than the width w1 of the first part 42A1 at the lower end 42K1, and the lower end 42K1 of the first part 42A1 and the lower end 42K2 of the second part 42A2 extend in the first direction on the upward-facing surface 41 of the recess 40. With this structure, the strength of the second part can be improved, so that a light emitting device with a high strength can be obtained. However, in the light emitting device 2000A of the second embodiment, in the second direction, the width w2 of the second part at the lower end 42K2 of the second part 42A2 does not have to be greater than the width w1 of the first part 42A1 at the lower end 42K1, and at the upward-facing surface 41 of the recess 40, the lower end 42K1 of the first part 42A1 and the lower end 42K2 of the second part 42A2 do not have to extend in the first direction.

The light emitting device of the second embodiment may also include various configurations of the light emitting device of the first embodiment. For example, as shown in FIG. 11A, FIG. 11B, FIG. 11C, FIG. 12, and FIG. 13, light emitting devices 2000A1, 2000B1, and 2000C1 may include the first reflective member 81, the second reflective member 82 and/or the groove part 21G. The resin package 10D of the light emitting device 2000A1 has a shape similar to a shape of the resin package 10D of the light emitting device 2000A. The resin package 10E of the light emitting device 2000B1 has a shape similar to a shape of the resin package 10E of the light emitting device 2000B. The resin package 10F of the light emitting device 2000C1 has a shape similar to a shape of the resin package 10F of the light emitting device 2000C.

Figure 14:
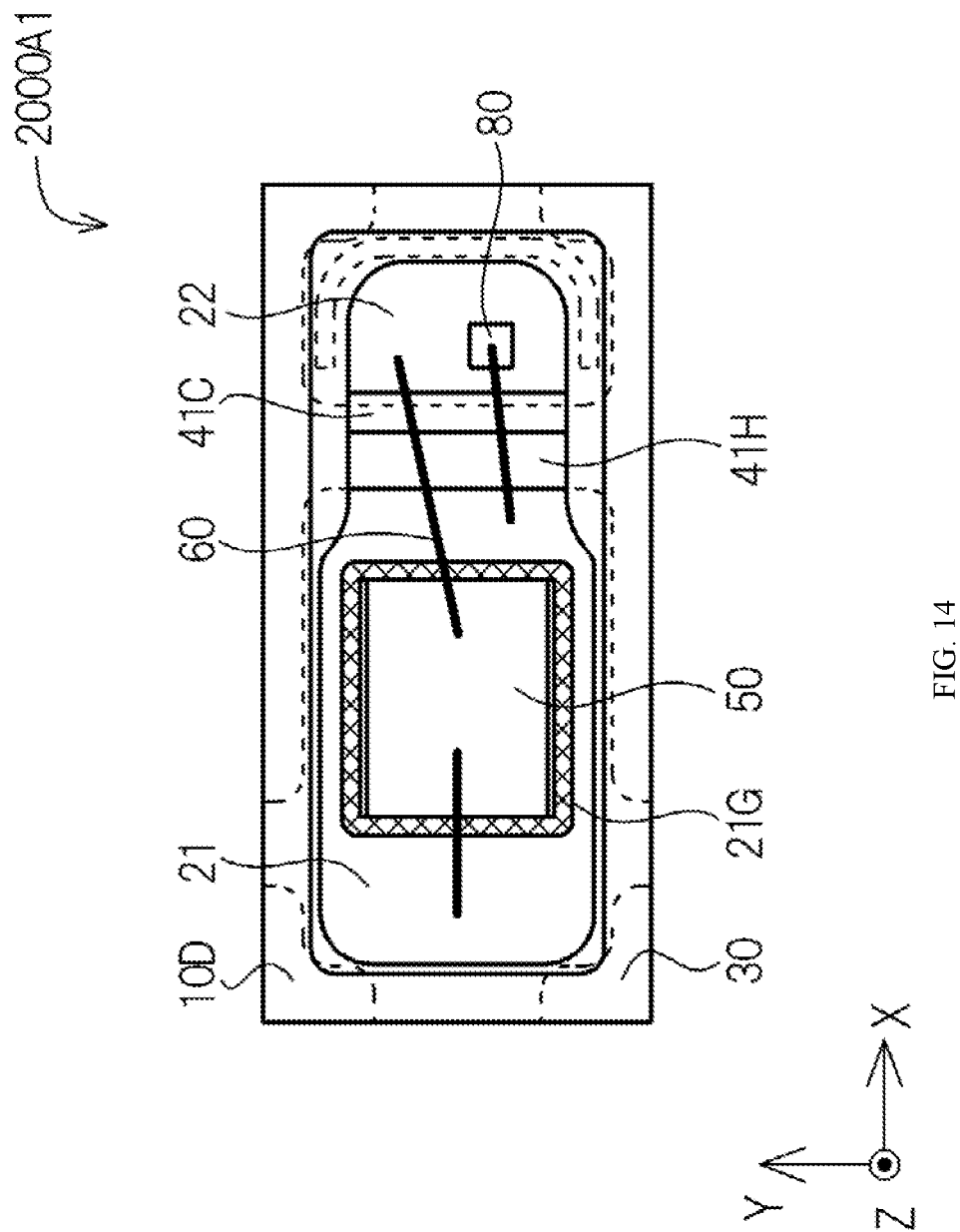
FIG. 14 is a schematic top view with a covering member, a first reflective member, and a second reflective member removed from the light emitting device of the second embodiment.

In a top plan view, a portion of the groove part may overlap the light emitting element, or a portion of the groove part may be separated from the light emitting element. As shown in FIG. 14, in a top plan view, at least one of inner edges of the groove part 21G (shown by cross hatching) may be separated from a corresponding one of outer edges of the light emitting element 50. With this structure, in a top plan view, the surface area of a portion of the groove part 21G that overlaps the light emitting element 50 can be reduced. Reduction of the surface area of a portion of the groove part 21G that overlaps the light emitting element 50 allows for inhibiting reduction of the volume of the first lead 21 located at the lower side of the light emitting element 50 even when the groove part 21G is formed on the first lead 21. This allows for reducing a decrease in the heat dissipation of the light emitting device. Also, in a top plan view, the groove part 21G and the light emitting element 50 may not overlap with each other. In other words, in the top view, all the outer edges of the light emitting element 50 may be separated from all the inner edges of the groove part 21G. With this structure, it is possible to further reduce a decrease in the heat dissipation of the light emitting device.

Figure 11A:
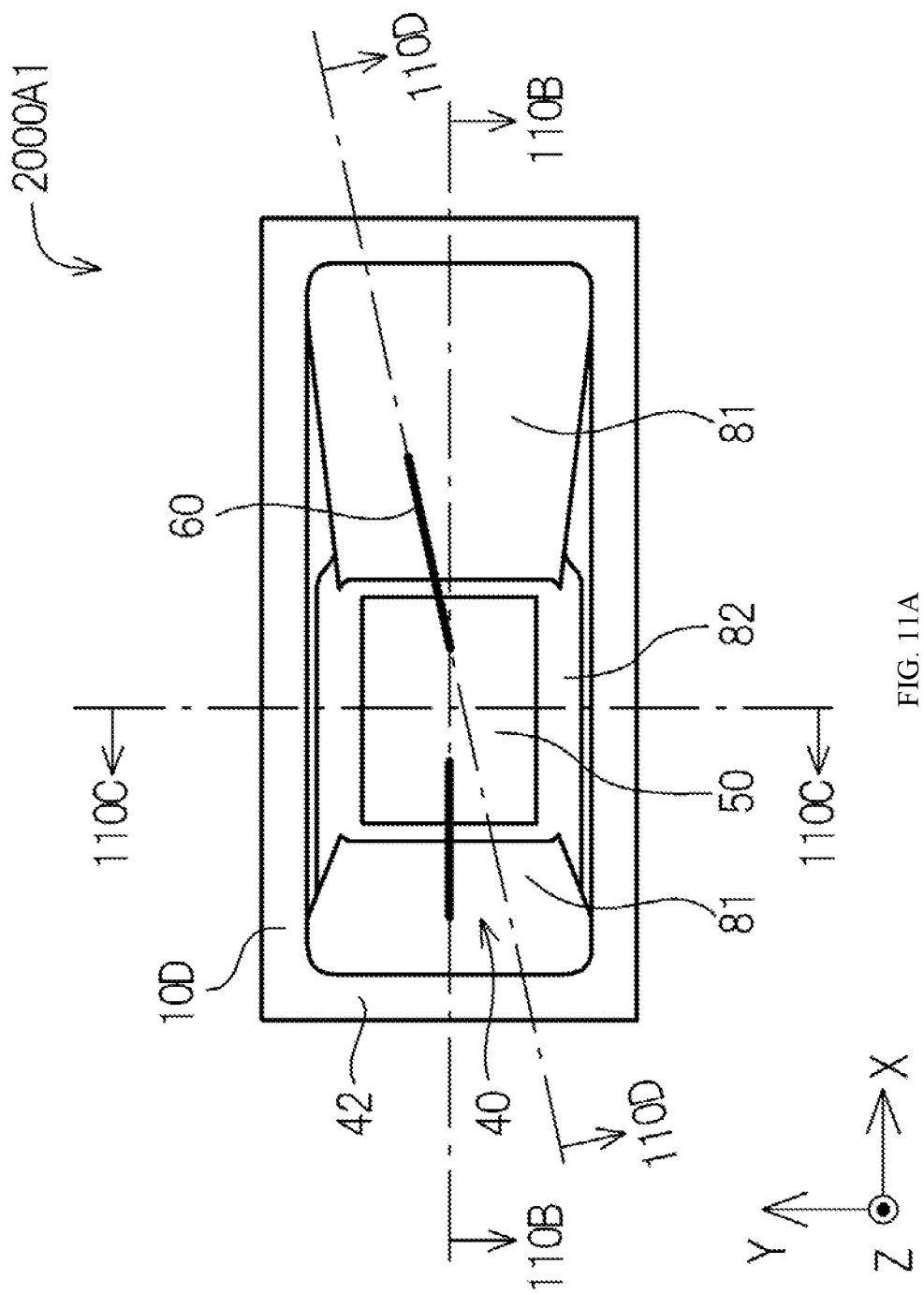
FIG. 11A is a schematic top view of Modification Example 6 of the light emitting device of the second embodiment.
Figure 11B:
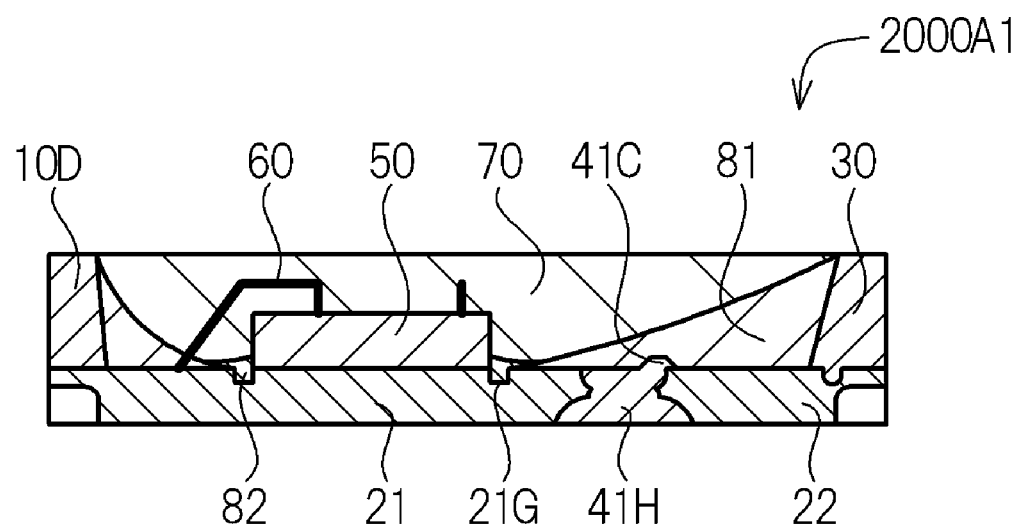
FIG. 11B is a schematic cross-sectional view taken along line 110B-110B of FIG. 11A.
Figure 11B:
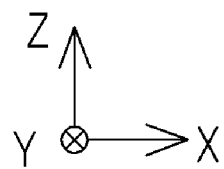
Figure 11C:
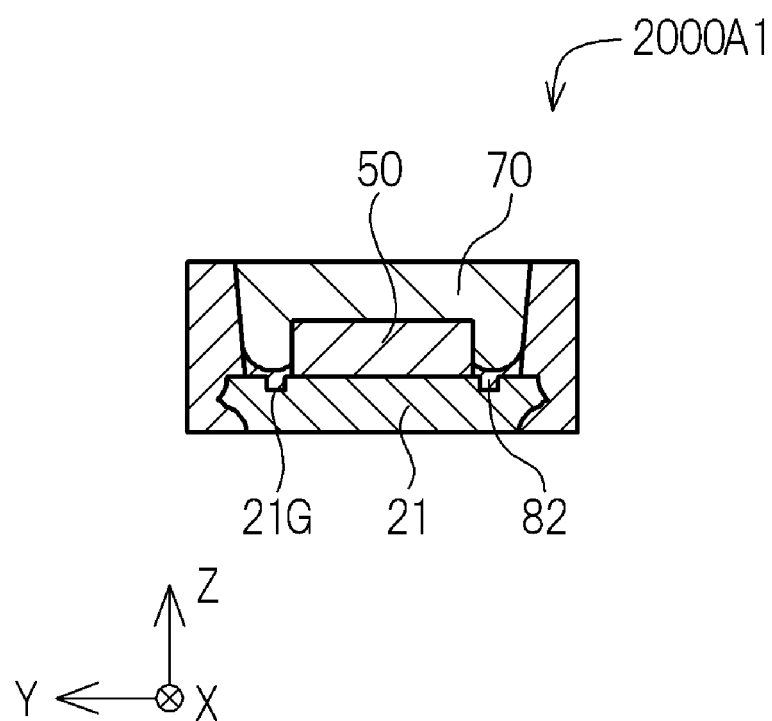
FIG. 11C is a schematic cross-sectional view taken along line 110C-110C of FIG. 11A.

As shown in FIG. 11B and FIG. 14, in a top plan view, it is preferable that at least one of the outer edges of the light emitting element 50 be located in the same plane as corresponding at least one of the inner edges of the groove part 21G. With this structure, it is possible to form the groove part near the light emitting element while reducing a decrease in the heat dissipation of the light emitting device. Forming the groove part near the light emitting element allows for disposing the first reflective member near the light emitting element. This allows for facilitating extraction of light emitted from the light emitting element using the first reflective member, so that the light extraction efficiency of the light emitting device can be improved.

Figure 11D:
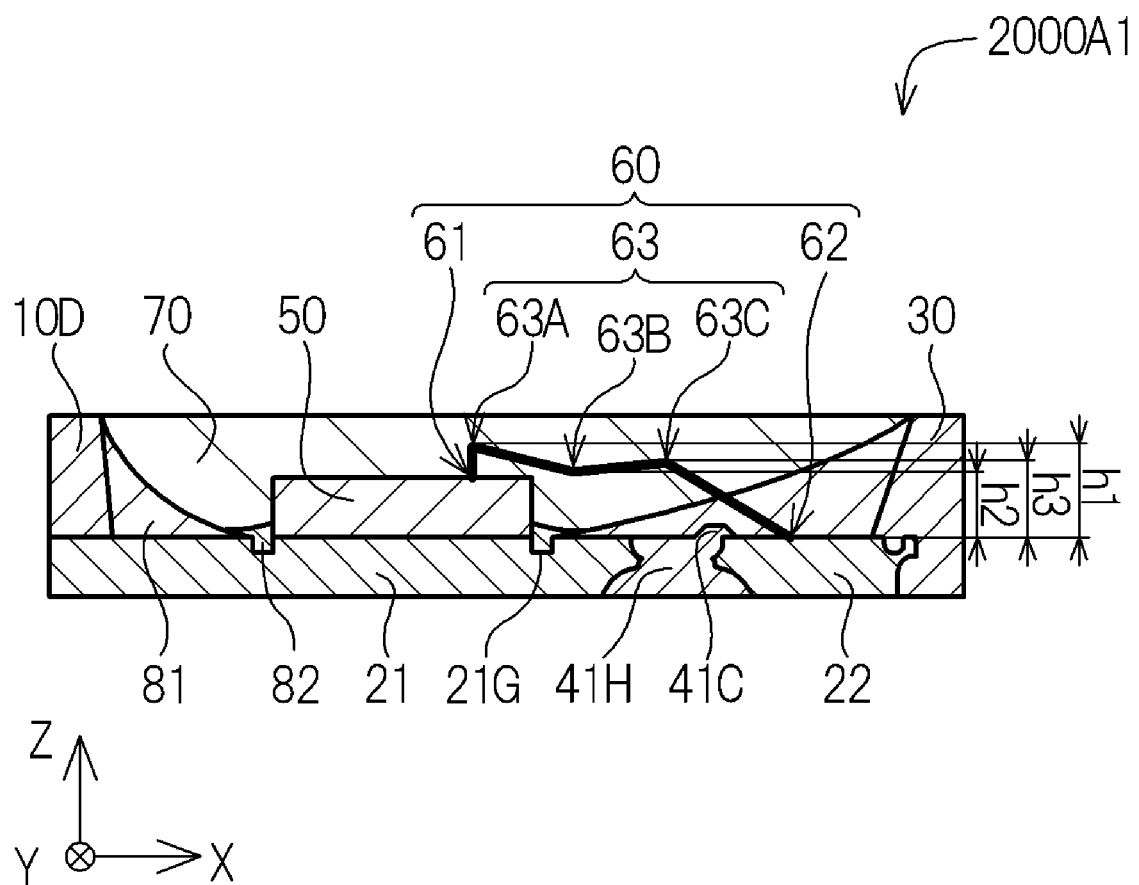
FIG. 11D is a schematic cross-sectional view taken along line 110D-110D of FIG. 11A.
Figure 11E:
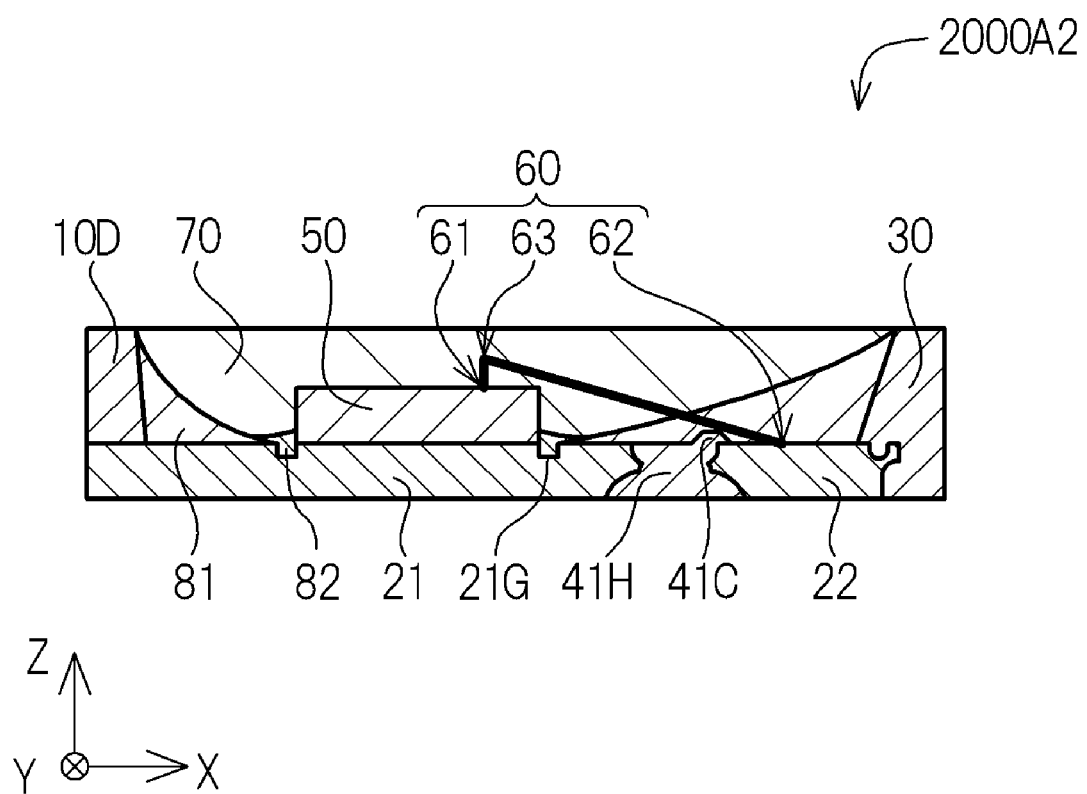
FIG. 11E is a schematic cross-sectional view of Modification Example 7 of the light emitting device of the second embodiment.

The wire 60 that electrically connects the light emitting element 50 and the second lead 22 may have a plurality of bent parts 63 as shown in FIG. 11D, or may have a single bent part 63 as shown in FIG. 11E. In particular, the wire 60 that electrically connects the light emitting element 50 and the second lead 22 preferably has a plurality of bent parts 63. In other words, the wire 60 that electrically connects the light emitting element 50 and the second lead 22 preferably has a first connecting part 61 connected to the light emitting element 50, a second connecting part 62 connected to the second lead 22, and a plurality of bent parts 63 between the first connecting part 61 and the second connecting part 62. With the wire 60 that electrically connects the light emitting element 50 and the second lead 22 and has the plurality of bent parts 63, it is possible to set the position of the plurality of bent parts 63 as appropriate. This allows for increasing the degree of freedom of the loop shape of the wire, which can facilitate inhibiting contact between the wire 60 and the covering resin portion 41C. The height of each of the plurality of bent parts 63 is preferably greater than the height of the covering resin portion 41C. With this structure, it is possible to further inhibit contact between the wire 60 and the covering resin portion 41C. In this specification, the term "bent part" refers to a portion of the wire 60 located between the first connecting part 61 and the second connecting part 62 with a difference in an extending direction of the wire by ±10° or greater. Also, in this specification, the expression "a height of a bent part 63C" refers to the maximum distance between the upper surface of the first lead and the upper surface of the bent part in the third direction (Z axis direction).

Figure 11F:
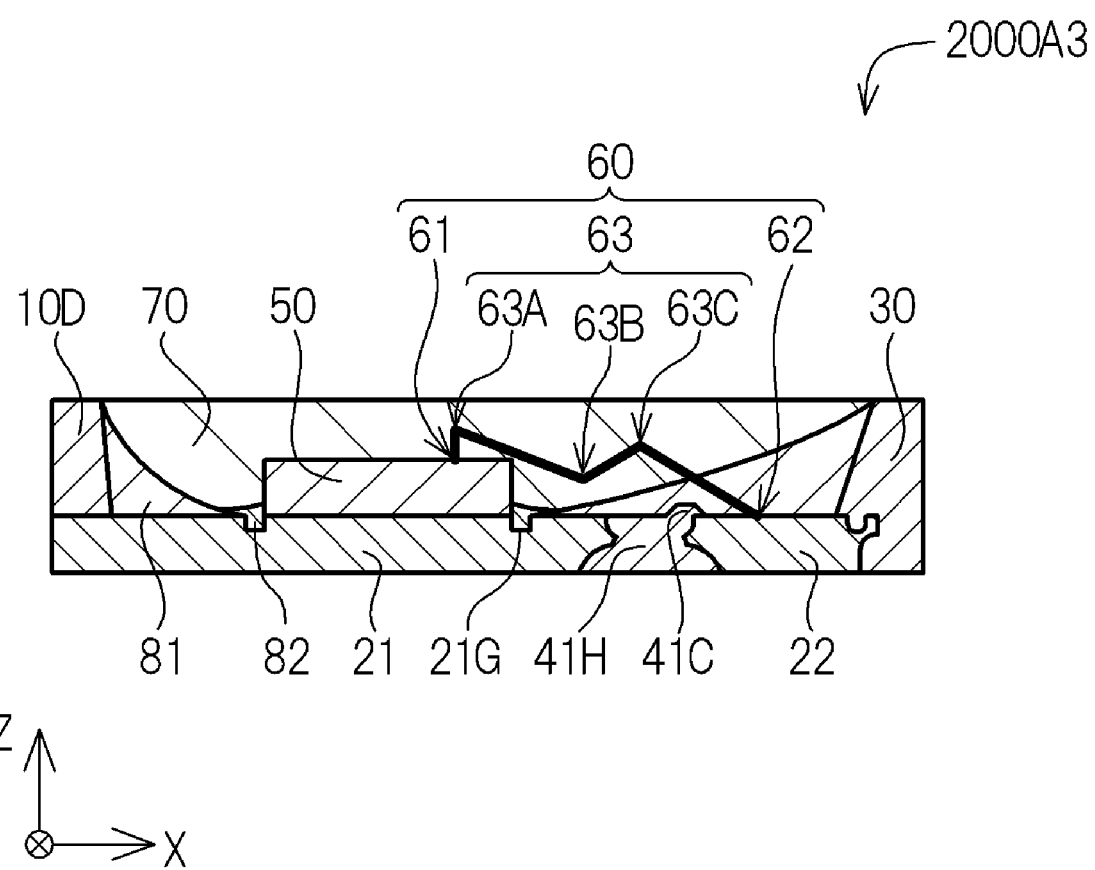
FIG. 11F is a schematic cross-sectional view of Modification Example 8 of the light emitting device of the second embodiment.
Figure 12:
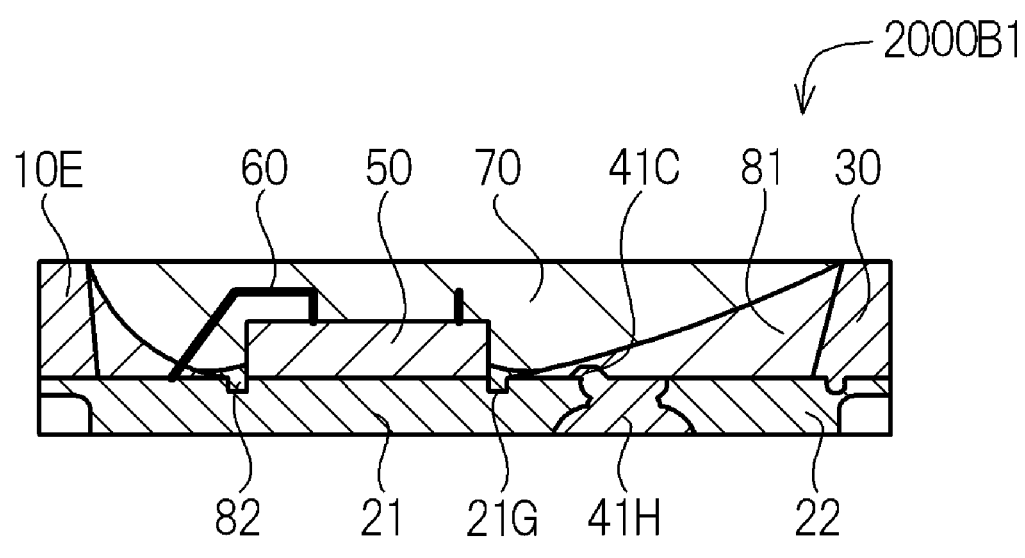
FIG. 12 is a schematic cross-sectional view of Modification Example 9 of the light emitting device of the second embodiment.
Figure 13:
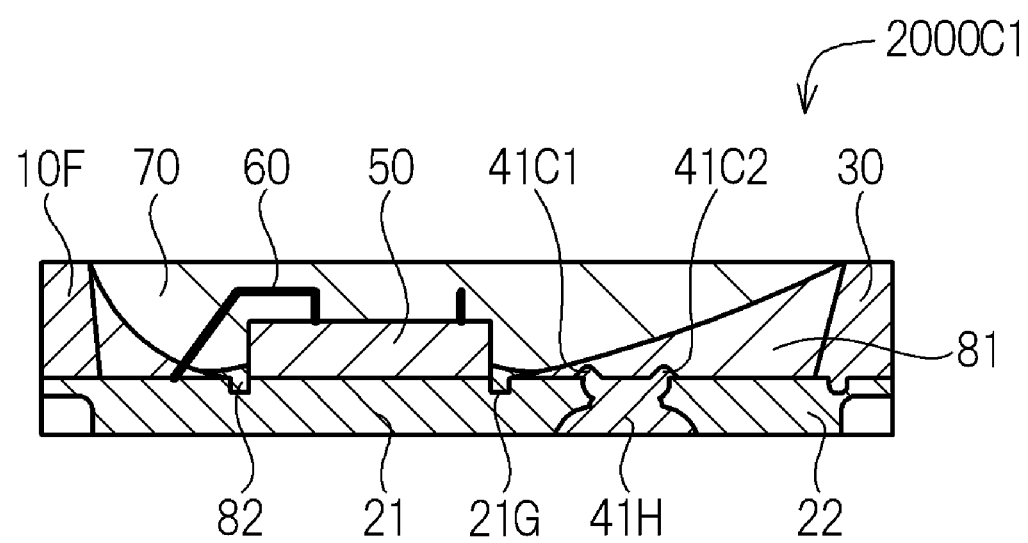
FIG. 13 is a schematic cross-sectional view of Modification Example 10 of the light emitting device of the second embodiment.

As shown in FIG. 11D, a height of each of the plurality of bent parts 63 may be greater than a height of the light emitting element, or as shown in FIG. 11F, a height of at least one bent part 63 of the plurality of bent parts 63 may be smaller than a height of the light emitting element. The expression "a height of each of the plurality of bent parts 63 is greater than a height of the light emitting element" indicates that height(s) of all the plurality of bent parts 63 is greater than a height of the light emitting element. With this structure, it is possible to inhibit contact of the wire 60 to the outer surface of the light emitting element 50 and the covering resin portion 41C. In this specification, the term "the outer surface of the light emitting element 50" refers to the upper surface of the light emitting element other than portions with the positive and negative electrodes and the lateral surface of the light emitting element. Also, when a height of at least one bent part of the plurality of bent parts 63 is smaller than a height of the light emitting element, it is possible to reduce the volume of the covering member 70 located below the wire 60. Accordingly, even when the covering member 70 expands or contracts, a stress that the wire 60 experiences from the covering member 70 can be reduced. This allows for reducing the deformation of the wire.

The plurality of bent parts 63 may include a first bent part 63A, a second bent part 63B, and a third bent part 63C. When the wire 60 that electrically connects the light emitting element 50 and the second lead 22 has the first bent part 63A, the second bent part 63B, and the third bent part 63C in this order from the first connecting part 61, the third bent part 63C preferably has a height h3 greater than a height h2 of the second bent part 63B. With a higher height h3 of the third bent part 63C, it is possible to increase the inclination angle of the wire 60 located between the third bent part 63C and the second connecting part 62. This allows for inhibiting contact between the wire 60 and the covering resin portion 41C. In this specification, the "inclination angle" refers to an angle of 90° or less among angles with respect to a plane defined by the first direction (X axis direction) and the second direction (Y axis direction). The height h2 of the second bent part 63B and the height h3 of the third bent part 63C is preferably smaller than the height h1 of the first bent part 63A. With this structure, a length of the wire 60 can be reduced, which can facilitate a reduction in variation of the loop shape of the wire. Also, with the height h1 of the first bent part 63A greater than the height h2 of the second bent part 63B and the height h3 of the third bent part 63C, it is possible to increase the inclination angle of the wire 60 located between the first bent part 63A and the second bent part 63B. This allows for inhibiting contact between the wire 60 and the outer surface of the light emitting element 50.

As shown in FIG. 11D, when the height h2 of the second bent part 63B is smaller than the height h1 of the first bent part 63A and the height h3 of the third bent part 63C, it is preferable that the second bent part 63B and the covering resin portion 41C do not overlap in a top plan view. This structure allows for facilitating inhibiting contact between the wire 60 and the covering resin portion 41C. Also, when the height h2 of the second bent part 63B is smaller than the height h1 of the first bent part 63A and the height h3 of the third bent part 63C, it is preferable that the second bent part 63B and the light emitting element 50 do not overlap in a top plan view. This structure allows for facilitating inhibiting contact between the wire 60 and the light emitting element 50.

In the first direction (X axis direction), the third bent part 63C may be located at a position closer to the first connecting part 61 than the covering resin portion 41C, or may be located at a position farther from the first connecting part 61 than the covering resin portion 41C. In particular, in the first direction, it is preferable that the third bent part 63C be located at a position closer from the first connecting part 61 than the covering resin portion 41C. In this specification, in the first direction, the expression "the third bent part 63C located at a position closer to the first connecting part 61 than the covering resin portion 41C" refers to that the shortest distance between the third bent part 63C and the first connecting part 61 in the first direction is smaller than the minimum distance between the covering resin portion 41C and the first connecting part 61 in the first direction. With the smaller shortest distance between the third bent part 63C and the first connecting part 61 in the first direction, variation in the loop shape of the wire between the first connecting part 61 and the third bent part 63C can be easily reduced. Accordingly, variation in the position of the first bent part 63A, the second bent part 63B, and the third bent part 63C can be reduced, which can facilitate inhibiting contact between the wire 60 and the covering resin portion 41C.

Components of the light emitting device according to certain embodiments of the present invention will be described below.

Resin Package 10

The light emitting element is disposed in the resin package 10. The resin package 10 includes at least the leads 20 and the resin part 30.

Leads 20

The leads 20 are electrically conductive members for supplying power to the light emitting element. Examples of a base member of the leads 20 include a metal such as copper, aluminum, gold, silver, iron, nickel, or an alloy of these, phosphor bronze, copper with iron, etc. These may be used in a single layer, or may be used in a layered structure (a clad material, for example). In particular, it is preferable to use copper, which is inexpensive and has high heat dissipation, for the base member. The lead 20 may have a metal layer on a surface of the base material. The metal layer may include silver, aluminum, nickel, palladium, rhodium, gold, copper, or an alloy of these, etc. The metal layer may be disposed on the entire surfaces of the leads 20, or may be disposed partially on surfaces of the leads 20. Also, a metal layer disposed in a region on the upper surface of each lead and a metal layer disposed in a region on the lower surface of each lead may be different from each other. For example, a metal layer structure including a plurality of layers including metal layers of nickel and silver is disposed on the upper surface of each lead, and a metal layer that does not include a metal layer of nickel is disposed on the lower surface of each lead. Also, for example, the metal layer of silver, etc., disposed on the upper surface of each lead may have a thickness greater than a thickness of the metal layer of silver, etc., disposed on the lower surface of each lead.

When a metal layer containing silver is disposed on the outermost surface of each lead 20, it is preferable to dispose a protective layer of silicon oxide, etc., on a surface of the metal layer containing silver. This allows for reducing discoloration of the metal layer containing silver caused by sulfur components, etc., in the atmosphere. The protective layer may be disposed using a vacuum process such as sputtering, etc., or another known method.

The leads 20 include at least the first lead 21 and the second lead 22. The leads 20 include two or more leads, and may include three or four leads. The light emitting element 50 is mounted on the first lead 21.

Resin Part 30

The resin part 30 holds the first lead 21 and the second lead 22. Examples of a resin material used for a base material of the resin part 30 include thermosetting resin, thermoplastic resin, etc. More specifically, for example, an epoxy resin composite, a silicone resin composite, a modified epoxy resin composite such as a silicone modified epoxy resin, a modified silicone resin composite such as epoxy modified silicone resin, an unsaturated polyester resin, a saturated polyester resin, a polyimide resin composite, a modified polyimide resin composite, or the like, or a resin such as polyphthalamide (PPA), polycarbonate resin, polyphenylene sulfide (PPS), liquid crystal polymer (LCP), ABS resin, phenol resin, acrylic resin, PBT resin, or the like may be used. In particular, a thermosetting resin such as an epoxy resin composite or a modified silicone resin composite is preferably used.

In the resin part 30, it is preferable that a light reflective substance be contained in the resin material serving as the base material. For the light reflective substance, it is preferable to use a member that does not easily absorb light emitted from the light emitting element, and that has a refractive index greatly different from that of the resin material serving as the base material. Examples of such a light reflective substance include titanium oxide, zinc oxide, silicon oxide, zirconium oxide, aluminum oxide, aluminum nitride, etc.

The resin part 30 may also contain a filler with a low light reflectance to light from outside the light emitting device (in many cases, sunlight) to improve the contrast of the light emitting device. In this case, the resin part 30 is black or has a color close to black, for example. For the filler, carbons such as acetylene black, activated carbon, or graphite, transition metal oxides such as iron oxide, manganese dioxide, cobalt oxide, or molybdenum oxide, colored organic pigments, etc., can be used according to the purpose.

Light Emitting Element 50

For the light emitting element, a semiconductor element configured to emit light by application of a voltage can be used, and a known semiconductor element formed of a nitride semiconductor, etc., can be used. Examples of the light emitting element include an LED chip. The light emitting element includes at least a semiconductor layer, and in many cases further includes an element substrate. In a top view, while it is preferable that the light emitting element have a substantially rectangular shape, particularly a substantially square shape or a substantially rectangular shape that is longer in the first direction, the light emitting element may have another polygonal shape such as a substantially hexagonal shape. The light emitting element has positive and negative electrodes on the upper surface. The positive and negative electrodes can be made of gold, silver, tin, platinum, rhodium, titanium, aluminum, tungsten, palladium, nickel, or alloys of two or more of these. For the semiconductor material, a nitride semiconductor is preferably used. The nitride semiconductor is mainly represented by general formula $In_xAl_yGa_{1-x-y}N$ ($0 \leq x$, $0 \leq y$, $x+y \leq 1$). In addition, it is also possible to use InAlGaAs type semiconductors, InAlGaP type semiconductors, zinc sulfide, zinc selenide, silicon carbide, etc. While the element substrate of the light emitting element is mainly a crystal growth substrate on which a semiconductor crystal forming a semiconductor layered structure can be grown, the element substrate of the light emitting element may be a bonding substrate for bonding to the semiconductor element structure separated from the crystal growth substrate. Examples of a base material of the element substrate include sapphire, gallium nitride, aluminum nitride, silicon, silicon carbide, gallium arsenide, gallium phosphide, indium phosphide, zinc sulfide, zinc oxide, zinc selenide, diamond, etc. Among these, sapphire is preferable. The thickness of the element substrate can be selected as appropriate. The element substrate can have a thickness of, for example, 0.02 mm or greater and 1 mm or less, and preferably has a thickness of 0.05 mm or greater and 0.3 mm or less in view of the strength of the element substrate and/or the thickness of the light emitting device.

Wire 60

The wire 60 electrically connects the light emitting element and each of the leads. For the wire 60, a wire made of a metal such as gold, copper, silver, platinum, aluminum, palladium, etc., or an alloy including one or more of these can be used. When the wire 60 contains gold, the wire can have high thermal resistance, etc., and is not easily broken even when experiencing stress from the covering member 70, and thus is advantageous. When the wire 60 contains silver, the wire 60 can have high light reflectance, and thus is advantageous. In particular, using a wire that contains both gold and silver is effective. When a wire that contains both gold and silver is used for the wire 60, it is possible to have the silver content of, for example, 15% or greater and 20% or less, 45% or greater and 55% or less, 70% or greater and 90% or less, or 95% or greater and 99% or less. In particular, when the silver content is 45% or greater and 55% or less, the possibility of occurrence of sulfurization can be reduced while obtaining a high light reflectance. The wire 60 can have a diameter that can be selected as appropriate, and can be 5 μm or greater and 50 μm or less, for example. The diameter of the wire 60 is preferably 10 μm or greater and 40 μm or less, and is more preferably 15 μm or greater and 30 μm or less.

Covering Member 70

The covering member 70 protects the light emitting element from external stress. For the covering member 70, it is possible to use a known resin material. Examples of the material of the covering member 70 include silicone resin, epoxy resin, phenol resin, polycarbonate resin, acrylic resin, or modified resins of these. Among these, silicone resin and modified silicone resin have high thermal resistance and light resistance, and thus are preferable.

The covering member 70 may also contain a known phosphor. Also, the covering member 70 may include diffusion particles. Examples of diffusion particles include silicon oxide, aluminum oxide, zirconium oxide, zinc oxide, etc. One of these types or a combination of two or more of these types may be used for the diffusion particles contained in the covering member 70. Silicon oxide, which has a low thermal expansion coefficient, is particularly preferable. Also, for the diffusion particles, nanoparticles can be used to increase scattering of light emitted from the light emitting element, so that it is possible to reduce the amount of phosphor used. The expression "nanoparticles" refers to particles of particle diameter 1 nm or greater to 100 nm or less. Also, in this specification, "particle diameter" is defined as $D_{50}$, for example.

Protective Element 80

The protective element 80 is a member for improving the electrostatic resistance. For the protective element, various protective elements typically mounted on general light emitting devices can be used. For example, it is possible to use a Zener diode for the protective element. In the light emitting device, the protective element and the light emitting element are connected in parallel.

First Reflective Member 81

The first reflective member 81 is disposed inside the recess. The first reflective member preferably contains a light reflective substance in the resin material as the base material, the same as with the resin part. As the material of the first reflective member, it is possible to use the same material as for the resin part.

Second Reflective Member 82

The second reflective member 82 is disposed inside the recess. The second reflective member preferably contains a light reflective substance in the resin material serving as a base material, as in the resin part. For a material of the second reflective member, it is possible to use the same material as a material used for the resin part.

The light emitting device according to certain embodiments of the present invention can be used for a backlight device of a liquid crystal display device, various types of luminaire, large display devices, various types of display devices for advertising or destination guidance, etc., projector devices, and also for image reading devices for digital video cameras, fax machines, copy machines, scanners, etc.

It is to be understood that although certain embodiments of the present invention have been described, various other embodiments and variants may occur to those skilled in the art that are within the scope and spirit of the invention, and such other embodiments and variants are intended to be covered by the following claims.

Denotation of Reference Numerals 1000, 1000A, 2000A, 2000B, 2000C, 2000A1, 2000A2, 2000A3, 2000B1, 2000C1: Light emitting device; 10, 10A, 10B, 10C, 10D, 10E, 10F Resin package; 20: Lead; 21: First lead; 22: Second lead; 30: Resin part; 42A: First long lateral wall; 42A1: First part; 42A2: Second part; 42B2: Second long lateral wall; 42B1: Third part; 42B2: Fourth part; 42C: First short lateral wall; 42D: Second short lateral wall; 50: Light emitting element; 60: Wire; 70: Covering member; 80: Protective element; 81: First reflective member; and 82: Second reflective member.

What is claimed is:

1. A light emitting device comprising:
   a resin package having an elongated rectangular shape and including
      a first lead and a second lead, and
      a resin part holding the first lead and the second lead,
   the resin package defining a recess defined by a lateral wall and an upward-facing surface constituting a bottom of the recess,
      the upward-facing surface including an upper surface of a portion of the first lead, an upper surface of a portion of the second lead, and an upper surface of a portion of the resin part,
      the lateral wall including a portion of the resin part; and
   a light emitting element disposed on the first lead at the upward-facing surface of the recess,
   wherein, in a top view, the lateral wall includes
      a first long lateral wall and a second long lateral wall facing each other and extending in a first direction, and
      a first short lateral wall and a second short lateral wall facing each other and extending in a second direction orthogonal to the first direction,
   the first long lateral wall includes
      a first part located on the first lead, and having an upper end and a lower end that is located on the upward-facing surface of the recess, and
      a second part located on the first lead and the second lead, and having an upper end and a lower end that is located on the upward-facing surface of the recess,
   in the second direction, a width of the second part at the lower end is greater than a width of the first part at the lower end.

2. The light emitting device of claim 1, wherein
   the second long lateral wall includes
      a third part located on the first lead, and having an upper end and a lower end that is located on the upward-facing surface of the recess, and
      a fourth part located on the first lead and the second lead, and having an upper end and a lower end that is located on the upward-facing surface of the recess,
   in the second direction, a width of the fourth part at the lower end of the fourth part greater than a width of the third part at the lower end of the third part, and
   the lower end of the third part and the lower end of the fourth part extend in the first direction at the upward-facing surface of the recess.

3. The light emitting device of claim 1, wherein
   the lower end of the second part extends in the first direction on the upper surface of the portion of the upper surface of the resin part constituting the upward-facing surface.

4. The light emitting device according to claim 1, wherein
   In the second direction, the width of the second part at the lower end is 1.1 times or greater and 3 times or less of the width of the first part at the lower end.

5. The light emitting device according to claim 1, wherein
   the upper end of the first part located on an inner lateral surface and the upper end of the second part located on an inner lateral surface extend on the same straight line.

6. The light emitting device according to claim 1, further comprising
   a first reflective member inside the recess, and the first reflective member covering the lateral wall spaced apart from the light emitting element.

7. The light emitting device according to claim 1, wherein
   at least one of the first lead and the second lead has a through hole, and
   a portion of the resin part is arranged inside the through hole.

8. The light emitting device according to claim 1, wherein
   inside the recess, the resin part covers a portion of the upper surface of at least one of the first lead and the second lead.

9. The light emitting device according to claim 1, further comprising
   a second reflective member inside the recess, the second reflective member being in contact with the light emitting element.

10. The light emitting device according to claim 9, wherein
    the first lead defines a groove part in the upper surface of the first lead, and the groove part surrounds the light emitting element, and
    the second reflective member is arranged inside the groove part.

11. The light emitting device according to claim 1, wherein
    the first lead defines a groove part in the upper surface of the first lead, and the groove part surrounds the light emitting element in the top view.

12. The light emitting device according to claim 11, wherein
    in the top view, a portion of the groove part overlaps the light emitting element.

13. A light emitting device comprising:
    a resin package having an elongated rectangular shape and including
       a first lead and a second lead, and
       a resin part holding the first lead and the second lead, the resin package defining a recess defined by a lateral wall and an upward-facing surface constituting a bottom of the recess,
the upward-facing surface including an upper surface of a portion of the first lead, an upper surface of a portion of the second lead, and an upper surface of a portion of the resin part,
the lateral wall including a portion of the resin part;
a light emitting element disposed on the first lead at the upward-facing surface of the recess; and
a wire electrically connecting the light emitting element and the second lead,
wherein, in a top view, the lateral wall includes
a first long lateral wall and a second long lateral wall facing each other and extending in a first direction, and
a first short lateral wall and a second short lateral wall facing each other and extending in a second direction orthogonal to the first direction,
the resin part includes
a holding resin portion located between the first lead and the second lead at the upward-facing surface of the recess, and
a covering resin portion that covers a portion of an upper surface of the holding resin portion and at least one of a portion of an upper surface of the first lead and a portion of an upper surface of the second lead,
a portion of the upper surface of the holding resin portion being exposed from the covering resin portion, and the portion of the upper surface of the holding resin portion exposed from the covering resin portion being located on the same plane as the upper surface of the first lead and the upper surface of the second lead.

14. The light emitting device according to claim 13, further comprising
a first reflective member inside the recess, the first reflective member covering the lateral wall spaced apart from the light emitting element.

15. The light emitting device according to claim 13, wherein
in the first direction, a width of a part of the covering resin portion covering the at least one of the portion of the upper surface of the first lead and the portion of the upper surface of the second lead is smaller than a width of a part of the covering resin portion covering the portion of the upper surface of the holding resin portion.

16. The light emitting device according to claim 13, wherein
in the first direction, a width of the covering resin portion is smaller than a width a part of the holding resin portion exposed from the covering resin portion.

17. The light emitting device according to claim 13, wherein
a height of the covering resin portion is smaller than a height of the light emitting element as measured from the upward-facing surface.

18. The light emitting device according to claim 13, wherein
the covering resin portion connects the first long lateral wall and the second long lateral wall.

19. The light emitting device according to claim 13, further comprising
a second reflective member inside the recess, the second reflective member being in contact with the light emitting element.

20. The light emitting device according to claim 19, wherein
the first lead defines a groove part in the upper surface of the first lead, and the groove part surrounds the light emitting element, and
the second reflective member is arranged inside the groove part.

21. The light emitting device according to claim 13, wherein
the first lead defines a groove part in the upper surface of the first lead, and the groove part surrounds the light emitting element.

22. The light emitting device according to claim 21, wherein
in the top view, a portion of the groove part overlaps the light emitting element.

23. The light emitting device according to claim 21, wherein
in the top view, at least one of inner edges of the groove part is spaced apart from a corresponding one of outer edges of the light emitting element.

24. The light emitting device according to claim 13, wherein
the first long lateral wall includes
a first part located on the first lead, and having an upper end and a lower end that is located on the upward-facing surface of the recess, and
a second part located on the first lead and the second lead, and having an upper end and a lower end that is located on the upward-facing surface of the recess,
in the second direction, a width of the second part at the lower end is greater than a width of the first part at the lower end, and
the lower end of the first part and the lower end of the second part extend in the first direction at the upward-facing surface of the recess.

25. The light emitting device according to claim 24, wherein
the second long lateral wall includes
a third part located on the first lead, and having an upper end and a lower end that is located on the upward-facing surface of the recess, and
a fourth part located on the first lead and the second lead, and having an upper end and a lower end that is located on the upward-facing surface of the recess, and
in the second direction, a width of the fourth part at the lower end is greater than a width of the third part at the lower end, and
the lower end of the third part and the lower end of the fourth part extend in the first direction at the upward-facing surface of the recess.

26. The light emitting device according to claim 24, wherein
the lower end of the second part extends in the first direction on the portion of the upper surface of the resin part constituting the upward-facing surface.

27. The light emitting device according to claim 24, wherein
the width of the second part at the lower end is 1.1 times or greater and 3 times or less of the width of the first part at the lower end.

28. The light emitting device according to claim 24, wherein
the upper end of the first part located on an inner lateral surface and the upper end of the second part located on an inner lateral surface extend on the same straight line.

29. The light emitting device according to claim 13, wherein
- the wire includes a first connecting part connected to the light emitting element, a second connecting part connected to the second lead, and a plurality of bent parts between the first connecting part and the second connecting part, and
- a height of a position of each of the bent parts is greater than a height of the covering resin portion as measured from the upward-facing surface.

30. The light emitting device according to claim 29, wherein
- the bent parts include a first bent part, a second bent part, and a third bent part arranged in this order from a first connecting part side, and
- the third bent part is positioned at a height greater than a height of the second bent part as measured from the upward-facing surface.

31. The light emitting device according to claim 30, wherein
- the third bent part is located closer to the first connecting part than the covering resin portion.

* * * * *